US008324675B2

(12) United States Patent
Moon et al.

(10) Patent No.: US 8,324,675 B2
(45) Date of Patent: Dec. 4, 2012

(54) FLASH MEMORY DEVICE HAVING VERTICAL CHANNEL STRUCTURE

(75) Inventors: Hui-chang Moon, Yongin-si (KR);
Han-soo Kim, Suwon-si (KR);
Won-seok Cho, Suwon-si (KR);
Jae-hoon Jang, Seongnam-si (KR);
Ki-hyun Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 133 days.

(21) Appl. No.: 12/644,976

(22) Filed: Dec. 22, 2009

(65) Prior Publication Data
US 2011/0024816 A1 Feb. 3, 2011

(30) Foreign Application Priority Data
Jul. 31, 2009 (KR) ........................ 10-2009-0070678

(51) Int. Cl.
*H01L 29/76* (2006.01)
(52) U.S. Cl. ........ 257/314; 257/315; 257/320; 257/321; 257/E21.422; 257/E29.3; 257/E29.309; 438/257
(58) Field of Classification Search .................. 257/314, 257/315, 320, 321, E21.422, E29.3, E29.309, 257/E21.679, 423, E21.662, E21.68, E29.693; 438/257
See application file for complete search history.

(56) References Cited

U.S. PATENT DOCUMENTS

| 2007/0158736 | A1* | 7/2007 | Arai et al. ...................... 257/315 |
| 2007/0252201 | A1* | 11/2007 | Kito et al. ...................... 257/331 |
| 2008/0149913 | A1* | 6/2008 | Tanaka et al. ...................... 257/5 |
| 2008/0173928 | A1* | 7/2008 | Arai et al. ...................... 257/316 |
| 2008/0179659 | A1* | 7/2008 | Enda et al. ...................... 257/326 |
| 2008/0253187 | A1* | 10/2008 | Aritome ................... 365/185.17 |

FOREIGN PATENT DOCUMENTS

| JP | 10-032269 | 2/1998 |
| JP | 10-093083 | 4/1998 |
| JP | 2008-186868 | 8/2008 |

* cited by examiner

*Primary Examiner* — A. Sefer
*Assistant Examiner* — Farid Khan
(74) *Attorney, Agent, or Firm* — F. Chau & Associates, LLC

(57) ABSTRACT

A flash memory device having a vertical channel structure. The flash memory device includes a substrate having a surface that extends in a first direction, a channel region having a pillar shape and extending from the substrate in a second direction that is perpendicular to the first direction, a gate dielectric layer formed around the channel region, a memory cell string comprising a plurality of transistors sequentially formed around the channel region in the second direction, wherein the gate dielectric layer is disposed between the plurality of transistors and the channel region, and a bit line connected to one of the plurality of transistors, and surrounding a side wall and an upper surface of one end of the channel region so as to directly contact the channel region.

20 Claims, 37 Drawing Sheets

FLASH MEMORY DEVICE HAVING VERTICAL CHANNEL STRUCTURE

CROSS-REFERENCE TO RELATED APPLICATION

This application claims the benefit of Korean Patent Application No. 10-2009-0070678, filed on Jul. 31, 2009, in the Korean Intellectual Property Office, the entire disclosure of which is incorporated herein by reference.

BACKGROUND

The inventive concept relates to a semiconductor device, and more particularly, to a flash memory device having a vertical channel structure.

Electronic products are getting smaller and require larger-scale data processing. As such, an integration degree of semiconductor memory devices used in the electronic products needs to be increased. In order to increase an integration degree of a semiconductor memory device, a flash memory device having a vertical transistor structure instead of a planar transistor structure has been suggested.

In a flash memory device having a vertical transistor structure, if the width of a channel region forming a cell string is reduced in order to increase an integration degree of a cell array, a contact area between the channel region of the cell string and a wire contacting the channel region on the cell string is reduced and thus a contact resistance between the channel region and the wire is increased.

SUMMARY

The inventive concept provides a reliable flash memory device having a vertical channel structure, in which a contact resistance between a channel region of a cell string and a wire formed on the channel region is reduced by increasing a contact area therebetween.

According to an aspect of the inventive concept, there is provided a flash memory device including a substrate having a surface that extends in a first direction, a channel region having a pillar shape and extending from the substrate in a second direction that is perpendicular to the first direction, a gate dielectric layer formed around the channel region, a memory cell string comprising a plurality of transistors sequentially formed around the channel region in the second direction, wherein the gate dielectric layer is disposed between the plurality of transistors and the channel region, and a bit line connected to one of the plurality of transistors, and surrounding a side wall and an upper surface of one end of the channel region so as to directly contact the channel region.

An upper surface of the channel region may be spaced apart from the substrate by a first distance. A lower surface of the bit line, which is closer to the substrate than the upper surface of the channel region, may be spaced apart from the substrate by a second distance. Accordingly, the second distance is less than the first distance.

An upper end of the channel region may include a protrusion of a first shape covered by the bit line. A recess having a second shape corresponding to the first-shape protrusion may be formed in the bit line so as to surround the first-shape protrusion.

The recess of the bit line may have a shape of a looped curve with respect to a lower surface of the bit line. Alternatively, the recess of the bit line may have a ring shape with respect to a lower surface of the bit line.

The memory cell string may include a plurality of first transistors forming a plurality of memory cells; a second transistor functioning as a string selection transistor; and a third transistor functioning as a ground selection transistor. The bit line may be connected to the second transistor. The memory cell string may include one second transistor. Alternatively, the memory cell string may include a pair of second transistors arranged in series.

A plurality of gate dielectric layers may be formed around the channel region, and an upper surface of a top layer of the gate dielectric layers may be spaced apart from the substrate by a first distance. An upper surface of the channel region may be spaced apart from the substrate by a second distance. wherein the first distance is less than the second distance.

The channel region may have a ring-type pillar shape having an internal space. An insulation pillar may fill in the internal space of the channel region.

According to an aspect of the inventive concept, there is provided a flash memory device including a substrate, a channel region extending from the substrate in a direction that is perpendicular to an upper surface of the substrate, a gate dielectric layer formed around the channel region, a plurality of transistors sequentially formed around the channel region in the extension direction of the channel region, wherein the gate dielectric layer is disposed between the plurality of transistors and the channel region, and a bit line surrounding a side wall and an upper surface of one end of the channel region so as to directly contact the channel region.

The upper surface of the one end of the channel region may be spaced apart from the substrate by a first distance, wherein a lower surface of the bit line is spaced apart from the substrate by a second distance, and wherein the second distance is less than the first distance.

The channel region may be pillar-shaped. Alternatively, the channel region may have a ring-type pillar shape having an internal space, wherein an insulation pillar fills the internal space of the channel region.

The insulation pillar may only partially fill the internal space of the channel region and a semiconductor may fill a remaining portion of the internal space to form an upper end of the channel region on the insulation pillar.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
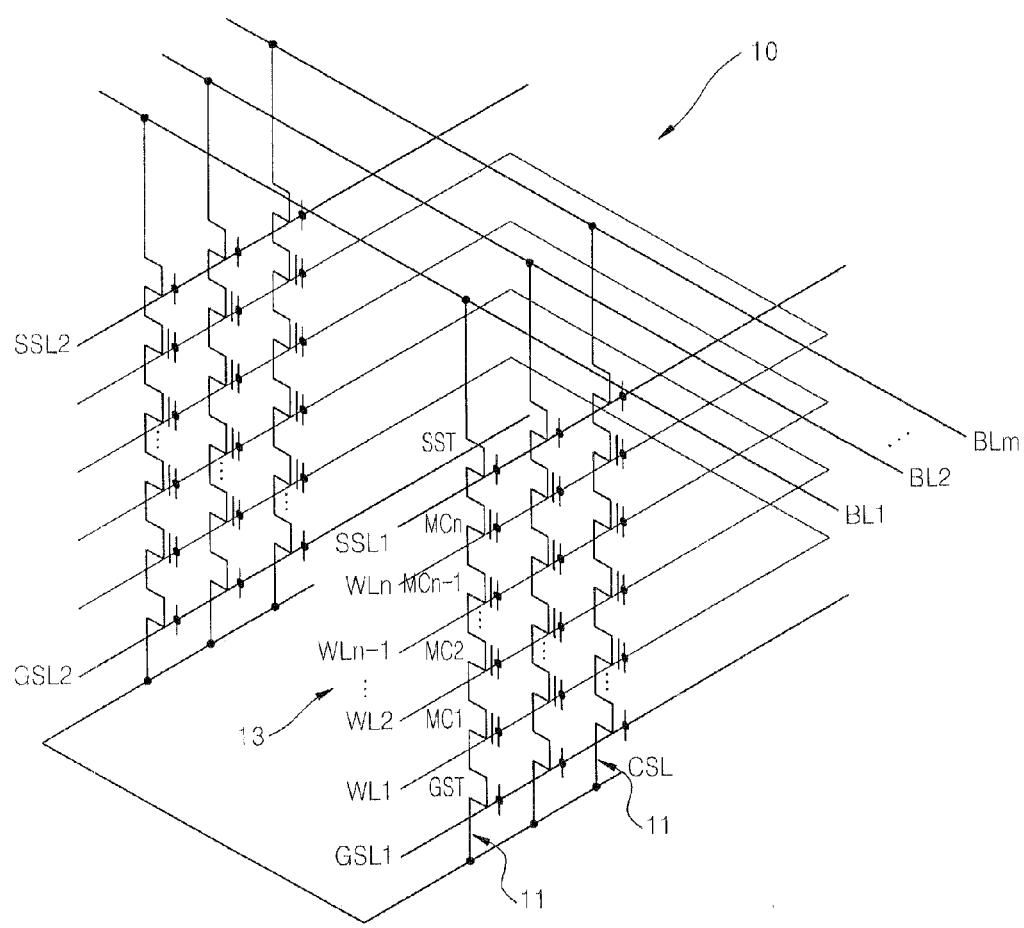
FIG. 1 is an equivalent circuit diagram of a memory cell array of a flash memory device, according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth therein. In the drawings, the sizes or thicknesses of layers and regions may be exaggerated for clarity.

FIG. 1 is an equivalent circuit diagram of a memory cell array 10 of a flash memory device, according to an embodiment of the inventive concept. FIG. 1 exemplarily illustrates a vertical NAND flash memory device having a vertical channel structure.

Referring to FIG. 1, the memory cell array 10 includes a plurality of memory cell strings 11. Each of the memory cell strings 11 has a vertical structure so as to extend perpendicularly to an extension direction of a main surface of a substrate (not shown). The memory cell strings 11 form a memory cell block 13.

Each of the memory cell strings 11 includes first through nth memory cells MC1 through MCn, a string selection transistor SST, and a ground selection transistor GST. In each of the memory cell strings 11, the ground selection transistor GST, the first through nth memory cells MC1 through MCn, and the string selection transistor SST are vertically arranged in series. The first through nth memory cells MC1 through MCn store data. First through nth word lines WL1 through WLn are respectively combined with the first through nth memory cells MC1 through MCn so as to respectively control the first through nth memory cells MC1 through MCn. The number of first through nth memory cells MC1 through MCn may be appropriately selected according to the capacity of the flash memory device.

First through mth bit lines BL1 through BLm are connected to one side of the respective memory cell strings 11 arranged at first through mth columns of the memory cell block 13, for example, to drain sides of string selection transistors SSTs. A common source line CSL may be connected to the other side of the respective memory cell strings 11, for example, to source sides of the ground selection transistors GSTs.

The first through nth word lines WL1 through WLn are commonly and respectively connected to gates of the first through nth memory cells MC1 through MCn at the same layers of the memory cell strings 11. Data may be programmed to be read from, or erased from the first through nth memory cells MC1 through MCn by respectively driving the first through nth word lines WL1 through WLn.

In each of the memory cell strings 11, the string selection transistors SSTs are arranged between the first through mth bit lines BL1 through BLm and the first through nth memory cells MC1 through MCn. In the memory cell block 13, the string selection transistors SSTs control data transmission between the first through mth bit lines BL1 through BLm and the first through nth memory cells MC1 through MCn by using a first string selection line SSL1 or a second string selection line SSL2 which are connected to gates of the string selection transistors SSTs.

The ground selection transistors GSTs are arranged between the first through nth memory cells MC1 through MCn and the common source line CSL. In the memory cell block 13, the ground selection transistors GSTs control data transmission between the first through nth memory cells MC1 through MCn and the common source line CSL by using a first ground selection line GSL1 or a second ground selection line GSL2 which are connected to gates of the ground selection transistors GSTs.

Figure 2:
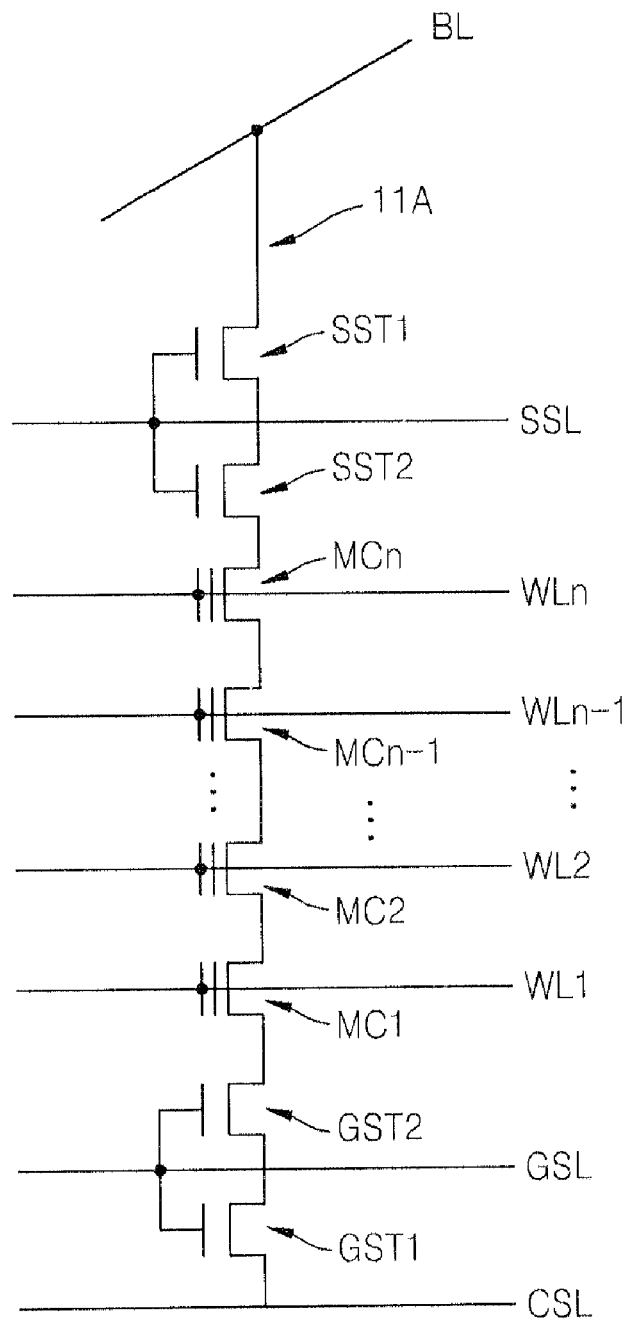
FIG. 2 is an equivalent circuit diagram of a memory cell array of a flash memory device, according to an embodiment of the inventive concept.

FIG. 2 is an equivalent circuit diagram of a memory cell array of a flash memory device, according to an embodiment of the inventive concept.

FIG. 2 exemplarily illustrates one memory cell string 11A included in a vertical NAND flash memory device having a vertical channel structure.

Like reference numerals in FIGS. 1 and 2 denote like elements.

In FIG. 1, a single string selection transistor SST is used in each of the memory cell strings 11. However, in FIG. 2, a pair of first and second string selection transistors SST1 and SST2 are arranged in series between a bit line BL and first through nth memory cells MC1 through MCn. In this case, a string selection line SSL may be commonly connected to gates of the first and second string selection transistors SST1 and SST2. The string selection line SSL may correspond to the first string selection line SSL1 or the second string selection line SSL2 illustrated in FIG. 1.

Also, in FIG. 1, a single ground selection transistor GST is used in each of the memory cell strings 11. However, in FIG. 2, a pair of first and second ground selection transistors GST1 and GST2 are arranged in series between the first through nth memory cells MC1 through MCn and a common source line CSL. In this case, a ground selection line GSL may be commonly connected to gates of the first and second ground selection transistors GST1 and GST2. The ground selection line GSL may correspond to the first ground selection line GSL1 or the second ground selection line GSL2 illustrated in FIG. 1.

In FIG. 2, the bit line BL may correspond to one of the first through mth bit lines BL1 through BLm illustrated in FIG. 1.

Figure 3:
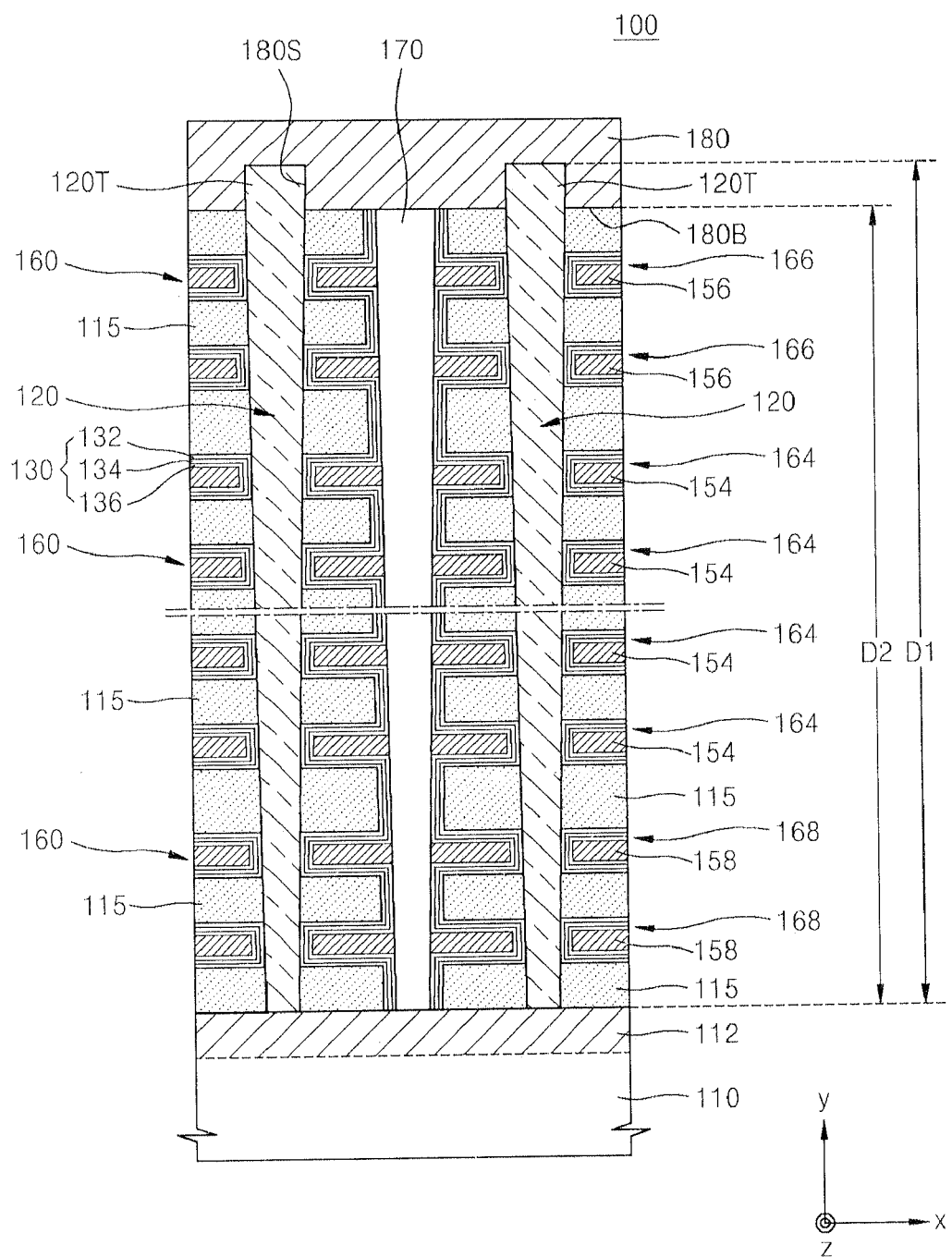
FIG. 3 is a cross-sectional view of a part of a flash memory device, according to an embodiment of the inventive concept.

FIG. 3 is a cross-sectional view of a part of a flash memory device 100, according to an embodiment of the inventive concept.

Referring to FIG. 3, the flash memory device 100 includes a substrate 110 having a main surface that extends in a first direction (the x direction). The substrate 110 contains a semiconductor material, e.g., a Group IV semiconductor, a Group III-V compound semiconductor, or a Group II-VI oxide semiconductor. For example, the Group IV semiconductor may be silicon (Si), germanium (Ge), or Si—Ge. The substrate 110 may also be provided as a bulk wafer or an epitaxial layer.

Channel regions 120 have a pillar shape and extend from the substrate 110 in a second direction (the y direction) that is perpendicular to the first direction.

Gate dielectric layers 130 are formed around the channel regions 120.

A plurality of transistors 160 are sequentially formed around the channel regions 120 in the second direction from an upper surface of the substrate 110. One channel region 120 and a plurality of transistors 160 formed around the channel region 120 in an elongated direction of the channel region 120 form one memory cell string (see 11 of FIG. 1 or 11A of FIG. 2).

The one memory cell string includes a plurality of first transistors 164 forming a plurality of memory cells and a plurality of second transistors including string selection transistors 166 and ground selection transistors 168. In the flash memory device illustrated in FIG. 2, the memory cell string 11A may include two string selection transistors 166 and two ground selection transistors 168 as the second transistors.

A bit line 180 is connected to the string selection transistors 166. The bit line 180 is formed in a linear pattern that extends in the first direction.

The bit line 180 may be connected to the string selection transistors 166 or the ground selection transistors 168. For example, in FIG. 3, the bit line 180 is connected to the string selection transistors 166 by using contacts (not shown). The bit line 180 surrounds side walls and upper surfaces of one end of each of the respective channel regions 120, which is far from the substrate 110, i.e., upper ends 120T of the channel regions 120, so as to directly contact the channel regions 120.

The upper surfaces of the upper ends 120T of the channel regions 120 are spaced apart from the substrate 110 by a first distance D1, and a lower surface 180B of the bit line 180, which is closer to the substrate 110, is spaced apart from the substrate 110 by a second distance D2. The second distance D2 is less than the first distance D1. For example, a difference between the first and second distances D1 and D2 may be equal to or greater than about 10 nm.

In FIG. 3, the upper ends 120T of the channel regions 120 are formed as pillar-shaped protrusions covered by the bit line 180. Recesses 180S defining spaces corresponding to the pillar-shape protrusions are formed in the bit line 180 so as to surround the pillar-shape protrusions. The recesses 180S of the bit line 180 may have the shape of a looped curve with respect to the lower surface 180B of the bit line 180.

A plurality of channel regions 120 are formed on the substrate 110 and a plurality of memory cell strings (see 11 of FIG. 1 or 11A of FIG. 2) are formed around the channel regions 120.

An impurity region 112 is formed in an upper portion of the substrate 110. The impurity region 112 is located under the channel regions 120 so as to function as sources, and may form a PN junction with the remaining portion of the substrate 110. The common source line CSL illustrated in FIGS. 1 and 2 may be connected to the impurity region 112.

Drain regions are formed at the upper ends 120T of the channel regions 120 and may be directly connected to the bit line 180.

The first transistors 164 include the gate dielectric layers 130 formed around the side walls of the channel regions 120, and control gate electrodes 154 formed around the channel regions 120 by disposing the gate dielectric layers 130 between the control gate electrodes 154 and the channel regions 120.

The string selection transistors 166 include the gate dielectric layers 130 formed around the side walls of the channel regions 120, and gate electrodes 156 formed around the channel regions 120 by disposing the gate dielectric layers 130 between the gate electrodes 156 and the channel regions 120. The ground selection transistors 168 include the gate dielectric layers 130 formed around the side walls of the channel regions 120, and gate electrodes 158 formed around the channel regions 120 by disposing the gate dielectric layers 130 between the gate electrodes 158 and the channel regions 120.

Referring, for example, to FIG. 3, the gate dielectric layers 130 may be formed by sequentially stacking tunneling dielectric layers 132, charge storage layers 134, and blocking dielectric layers 136 from the side walls of the channel regions 120. The charge storage layers 134 may be a trap type. For example, the charge storage layers 134 may be formed of quantum dots or nanocrystals. The quantum dots or the nanocrystals may be formed of a conductive material, for example, fine particles of a metal or a semiconductor. The tunneling dielectric layers 132 and the blocking dielectric layers 136 may comprise, for example, oxide films, nitride films, or high-dielectric films. A high-dielectric film refers to a dielectric film having a higher dielectric constant than those of an oxide film and a nitride film. Alternatively, in the gate dielectric layers 130, the tunneling dielectric layers 132 may be formed as oxide films, the charge storage layers 134 may be formed as nitride films, and the blocking dielectric layers 136 may be formed as aluminum (Al) oxide films.

The channel regions 120 are sequentially doped with the same conductive impurities in order to form wells and channels required for the first through nth memory cells MC1 through MCn illustrated in FIGS. 1 and 2. In this case, the connection between the first through nth memory cells MC1 through MCn during a program or read operation may be achieved by using a field effect-type source/drain. Surfaces of the channel regions 120 between the first through nth memory cells MC1 through MCn may be turned on by using a lateral field from the control gate electrodes 154, i.e., a fringing field. Similarly, with respect to the channel regions 120 between the string selection transistors 166 and the channel regions 120 between the ground selection transistors 168, the surfaces of these channel regions may be turned on by using lateral fields from the gate electrodes 156 and 158.

Interlayer dielectric layers 115 are disposed around the channel regions 120 and between the first transistors 164 and the second transistors including the string selection transistors 166 and the ground selection transistors 168. In FIG. 3, reference numeral 170 represents an insulating layer.

The gate dielectric layers 130 are not formed around the upper ends 120T of the channel regions 120, which protrude beyond top layers of the interlayer dielectric layers 115. That is, the distance (i.e., the second distance D2) from the substrate 110 to an upper surface of the top layer of the interlayer dielectric layers 115 in the second direction is less than the distance (i.e., the first distance D1) from the substrate 110 to upper surfaces of the channel regions 120 in the second direction.

Figure 4A:
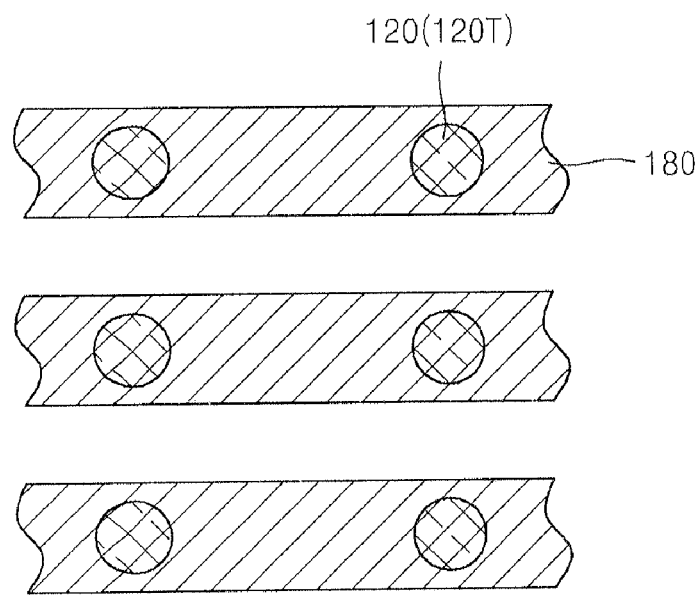
FIGS. 4A and 4B are plan views showing relative arrangements of bit lines and channel regions of the flash memory device illustrated in FIG. 3, according to embodiments of the inventive concept.
Figure 4B:
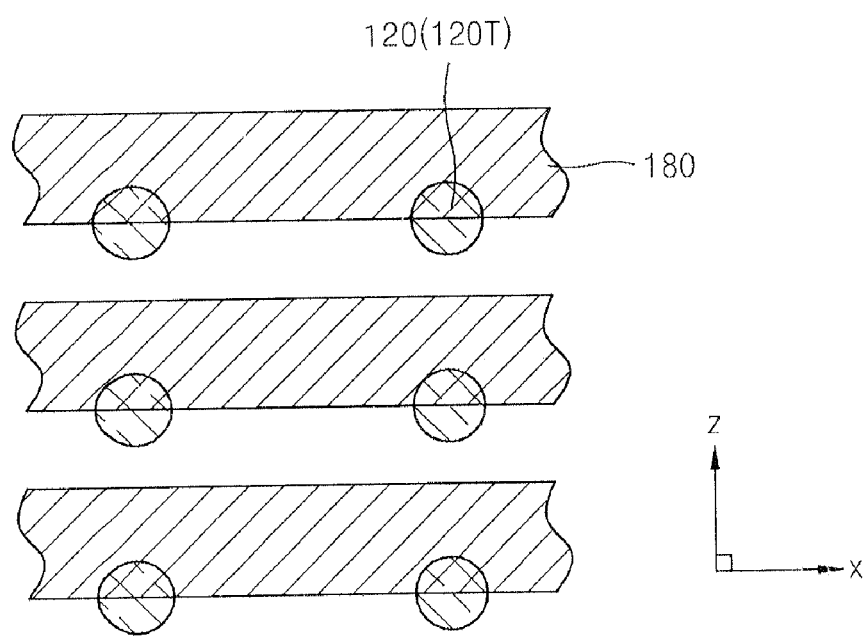

FIGS. 4A and 4B are plan views showing relative arrangements of the bit lines 180 and the channel regions 120 of the flash memory device 100 illustrated in FIG. 3, according to embodiments of the inventive concept.

As illustrated in FIG. 4A, the bit lines 180 may be formed to completely surround the upper ends 120T of the channel regions 120.

Alternatively, as illustrated in FIG. 4B, the bit lines 180 may be formed to partially surround the upper ends 120T of the channel regions 120.

FIGS. 5A through 5G are sequential cross-sectional views for describing a method of manufacturing the flash memory device 100 illustrated in FIG. 3, according to an embodiment of the inventive concept.

Figure 5A:
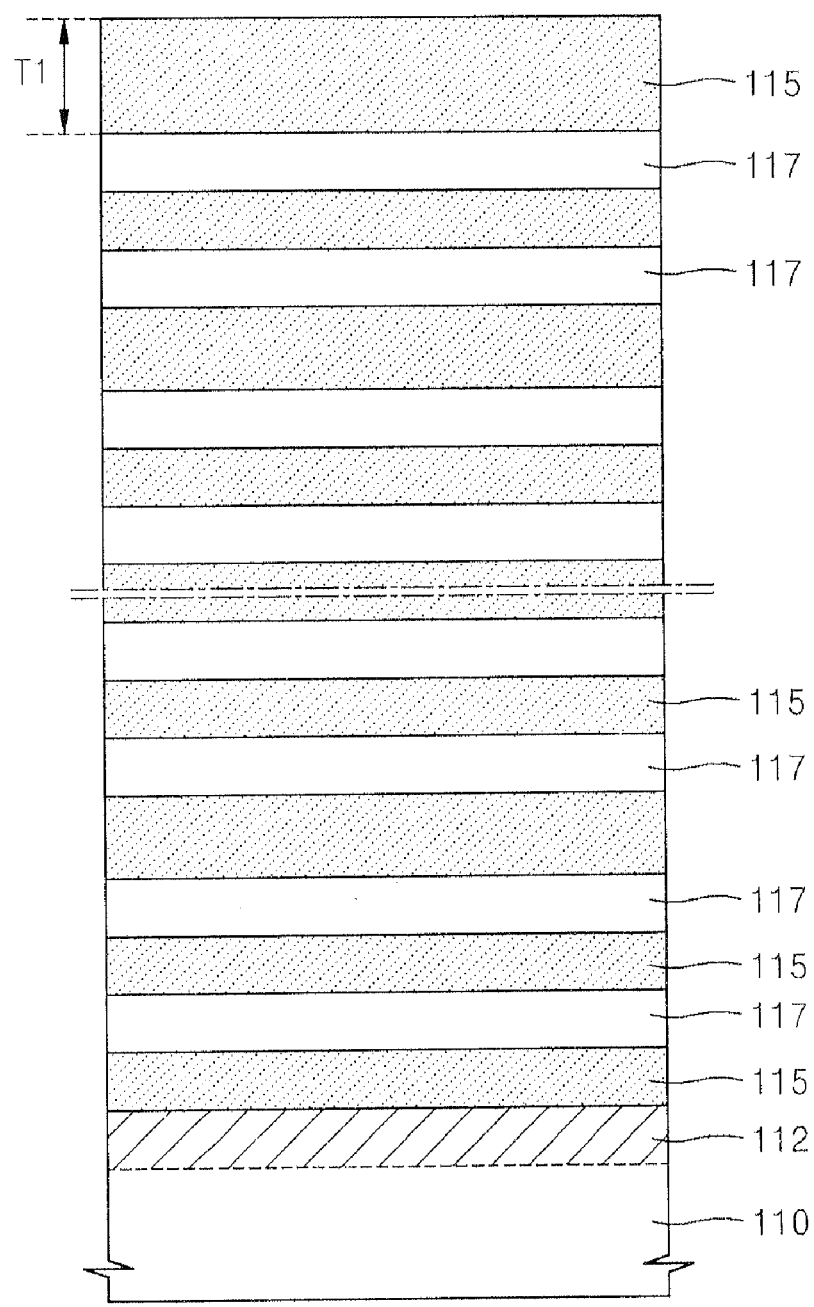
FIGS. 5A through 5G are sequential cross-sectional views for describing a method of manufacturing the flash memory device illustrated in FIG. 3, according to an embodiment of the inventive concept.

Referring to FIG. 5A, an impurity region 112 is formed by injecting impurities in a substrate 110. Then, a plurality of interlayer dielectric layers 115 and a plurality of sacrificial layers 117 are alternately stacked one-by-one on the substrate 110. The sacrificial layers 117 may be formed of a material having etch selectivity with respect to the interlayer dielectric layers 115. For example, the interlayer dielectric layers 115 may be formed of an oxide and the sacrificial layers 117 may be formed of a nitride.

The number of sacrificial layers 117 may vary according to the structure of a memory device to be formed. As the number of sacrificial layers 117 increases, the number of memory cells in a unit area also increases.

A top layer of the interlayer dielectric layers 115 has a thickness T1 greater than thicknesses of the other lower layers of the interlayer dielectric layers 115.

Figure 5B:
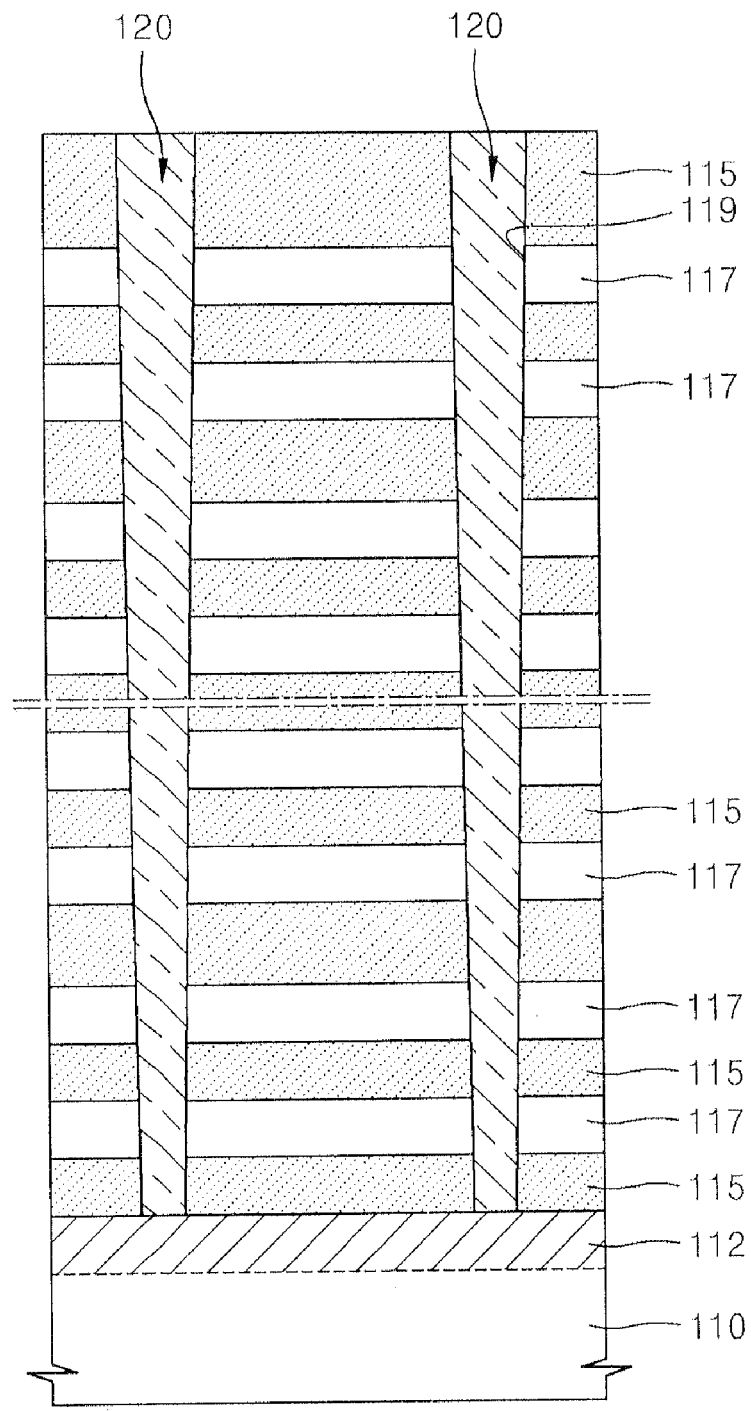

Referring to FIG. 5B, the interlayer dielectric layers 115 and the sacrificial layers 117 are etched by using a photolithography process so as to form a plurality of first holes 119 exposing portions of an upper surface of the substrate 110. Then, the first holes 119 are filled with a semiconductor material and a chemical mechanical polishing (CMP) process or an etch-back process is performed until an upper surface of the top layer of the interlayer dielectric layers 115 is exposed so as to remove the semiconductor material remaining on the top layer of the interlayer dielectric layers 115, thereby forming a plurality of channel regions 120 filled in the first holes 119. For example, the channel regions 120 may be formed of Si. The channel regions 120 may also be formed as Si epitaxial layers having a polycrystalline or monocrystalline structure.

Figure 5C:
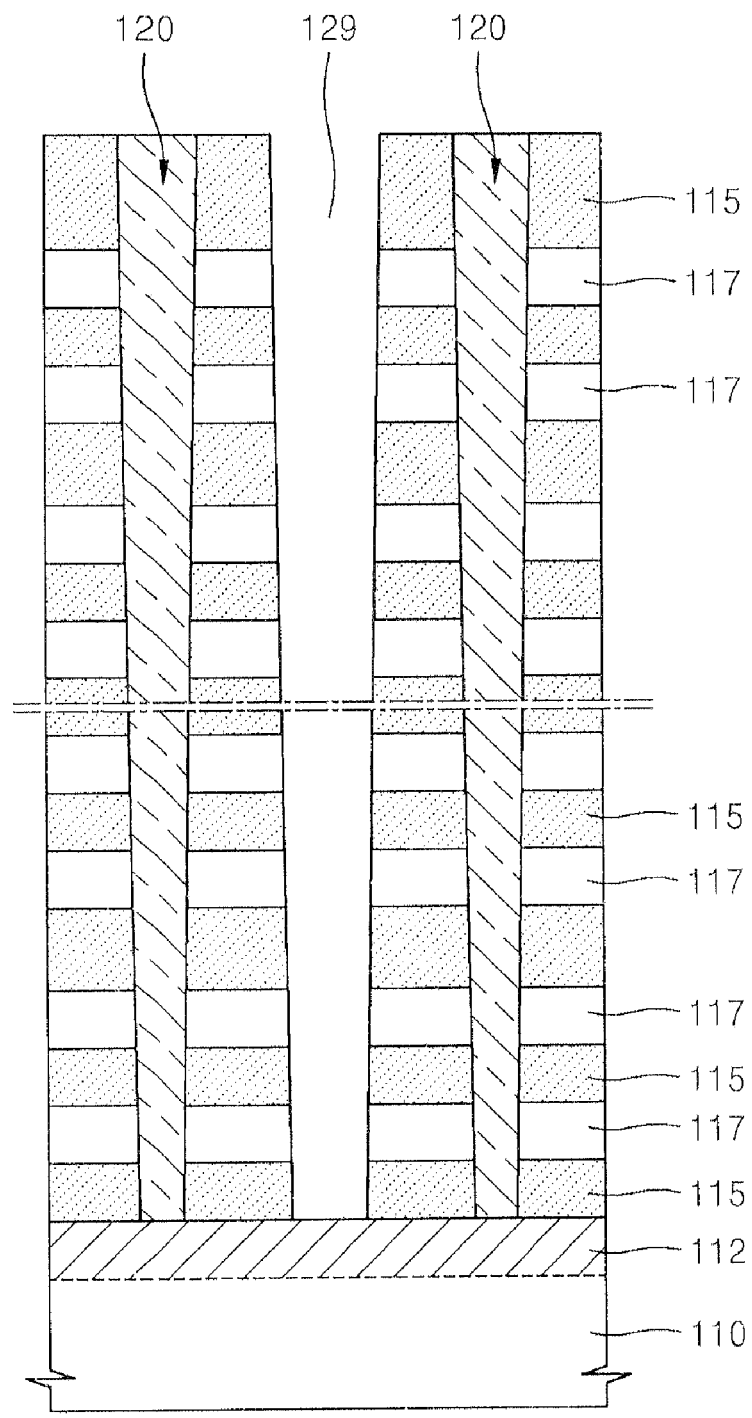

Referring to FIG. 5C, the interlayer dielectric layers 115 and the sacrificial layers 117 are etched between each of two neighboring channel regions 120 so as to form a plurality of second holes 129 exposing portions of the upper surface of the substrate 110. In FIG. 5C, only one of the second holes 129 is illustrated. A photolithography process may be used to form the second holes 129.

Figure 5D:
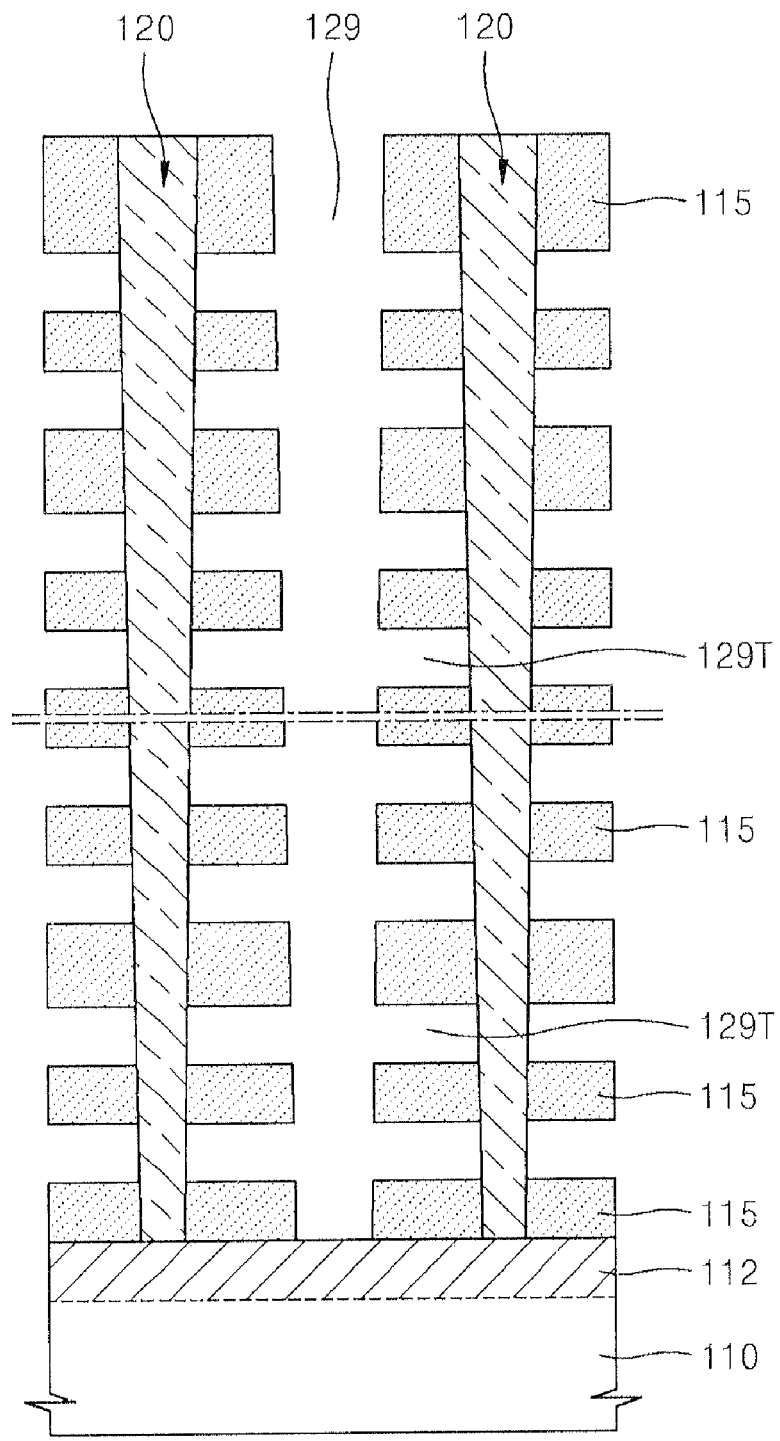

Referring to FIG. 5D, the sacrificial layers 117 exposed by the second holes 129 are removed.

For example, an isotropic etching process may be used to remove the sacrificial layers 117, wherein an etchant penetrates between the interlayer dielectric layers 115 through the second holes 129. The isotropic etching process may include a wet etching process or a chemical dry etching (CDE) process.

As the sacrificial layers 117 between the interlayer dielectric layers 115 are removed, a plurality of tunnels 129T connected to the second holes 129 are formed between the interlayer dielectric layers 115, and portions of side walls of the channel regions 120 are exposed by the tunnels 129T.

Figure 5E:
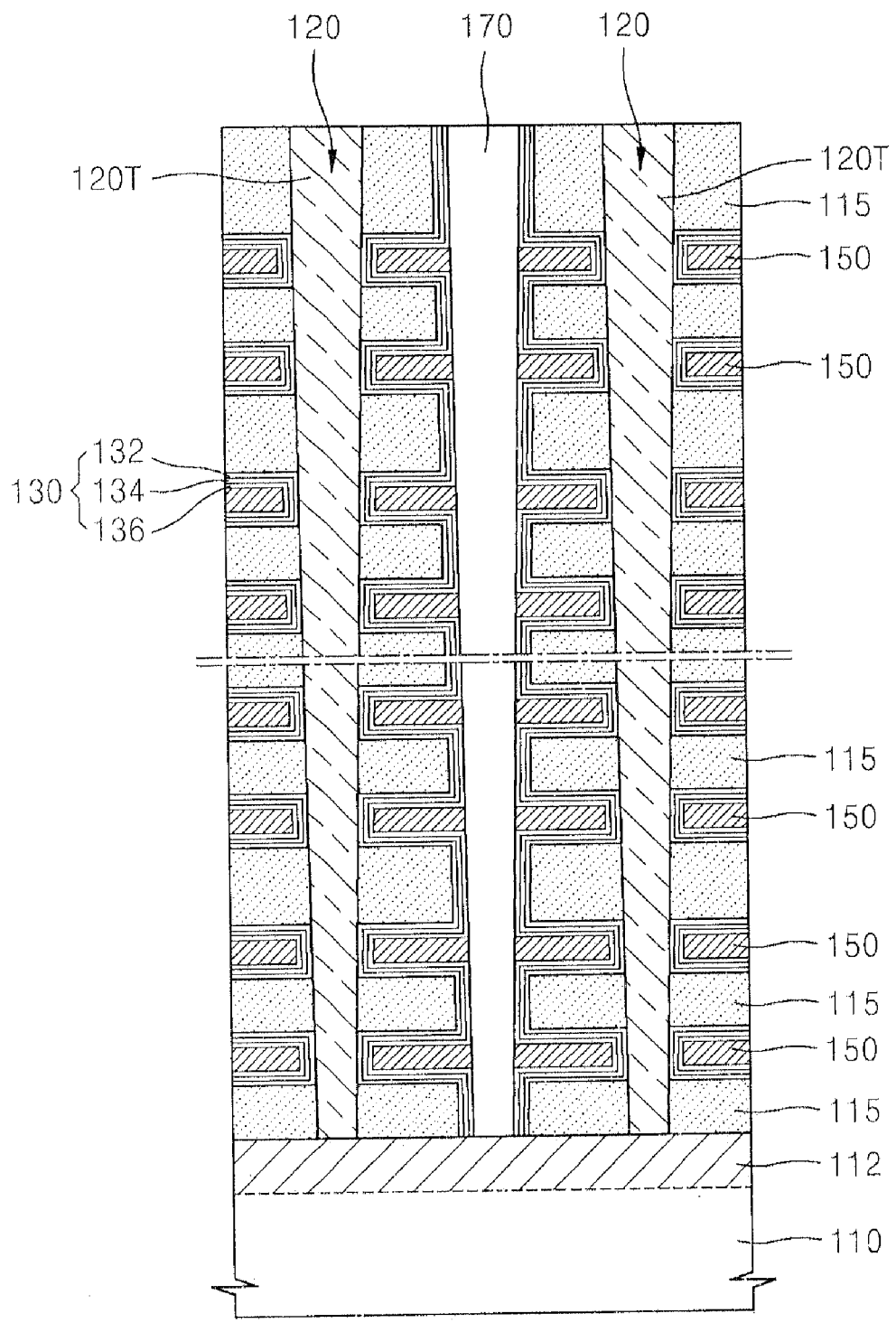

Referring to FIG. 5E, gate dielectric layers 130 are formed on exposed portions of the interlayer dielectric layers 115 and the channel regions 120, which are exposed by the second holes 129 and the tunnels 129T. The gate dielectric layers 130 are formed by sequentially stacking tunneling dielectric layers 132, charge storage layers 134, and blocking dielectric layers 136 from the side walls of the channel regions 120. Then, a conductive material is deposited through the second holes 129 so as to fill the tunnels 129T connected to the second holes 129 around the side walls of the channel regions 120. The conductive material remaining in the second holes 129 is removed, thereby forming conductive layers 150 only in the tunnels 129T. The conductive layers 150 function as the control gate electrodes 154 and the gate electrodes 156 and 158 illustrated in FIG. 3.

A chemical vapor deposition (CVD) process or an electroplating process may be used to form the gate dielectric layers 130 and the conductive layers 150. For example, the conductive layers 150 may be formed of tungsten (W).

Then, insulating layers 170 are filled in the second holes 129. Impurity regions (not shown) may be formed on upper ends 120T of the channel regions 120 by doping the upper ends 120T of the channel regions 120 with an impurity. The impurity region may not be always formed in the process of FIG. 5E. For example, the impurity region may be formed in a process before or after the process of FIG. 5E.

Figure 5F:
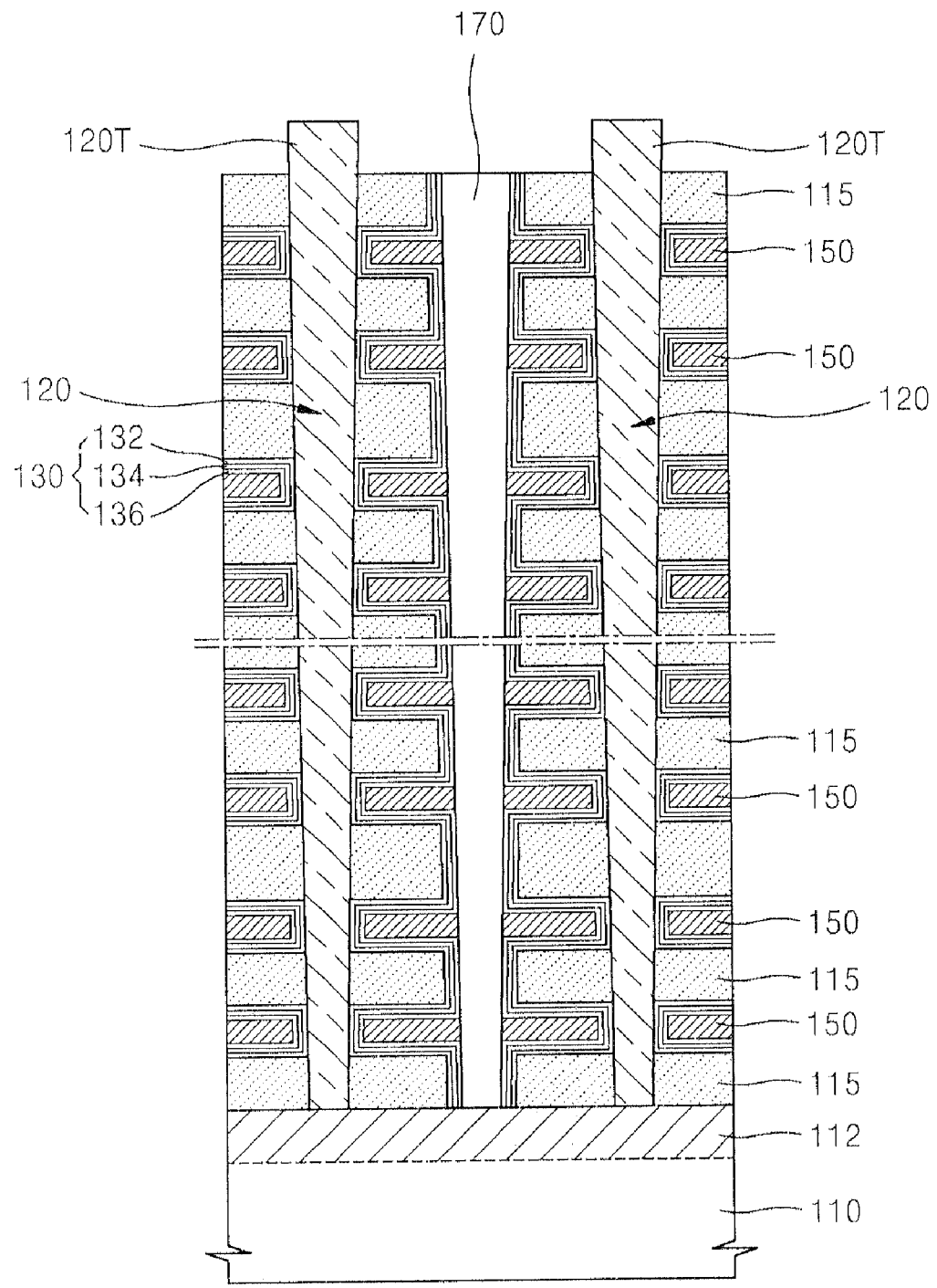

Referring to FIG. 5F, under an etching condition in which etching of the channel regions 120 is suppressed, and the gate dielectric layers 130, the top layer of the interlayer dielectric layers 115, and the insulating layers 170 have relatively high etch selectivities, the gate dielectric layers 130, the top layer of the interlayer dielectric layers 115, and the insulating layers 170 are selectively etched so as to be removed by a predetermined thickness to expose upper surfaces and side walls of the upper ends 120T of the channel regions 120.

Figure 5G:
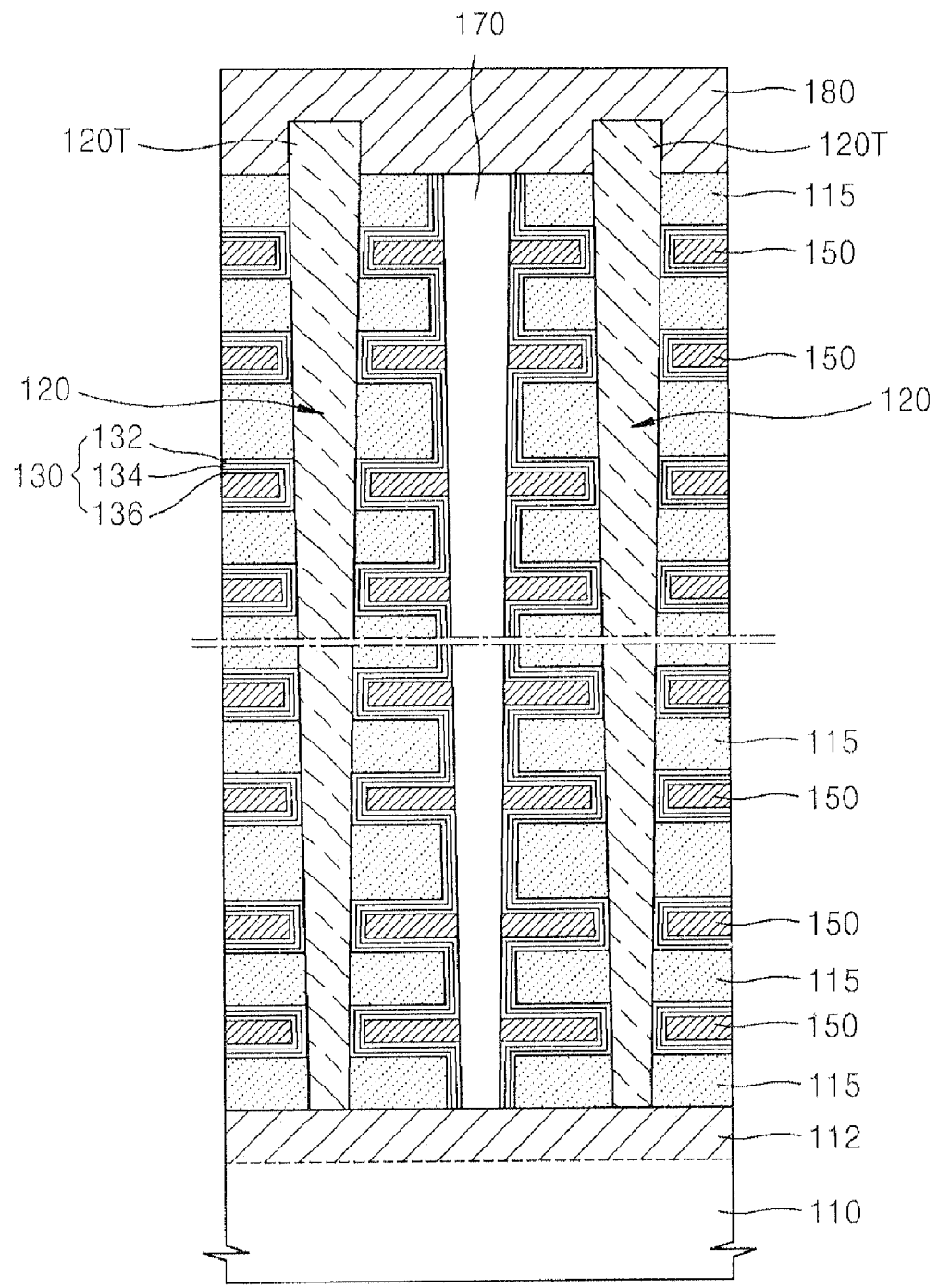

Referring to FIG. 5G, bit lines 180 are formed on the channel regions 120.

The bit lines 180 may be formed by using a Damascene process. For example, a series of processes may be performed to form the bit lines 180 as described below. Initially, an interlayer dielectric layer (not shown) is formed on the resultant structure in which the upper surfaces and the side walls of the upper ends 120T of the channel regions 120 are exposed. Then, a plurality of linear spaces exposing the upper surfaces and the side walls of the upper ends 120T of the channel regions 120 are formed by removing portions of the interlayer dielectric layer. Then, a conductive material such as tungsten (W) is filled in the spaces. Then, the conductive material remaining on the interlayer dielectric layer is removed by using a CMP process or an etch-back process such that the conductive material remains only in the spaces formed in the interlayer dielectric layer, thereby forming the bit lines 180.

Figure 6:
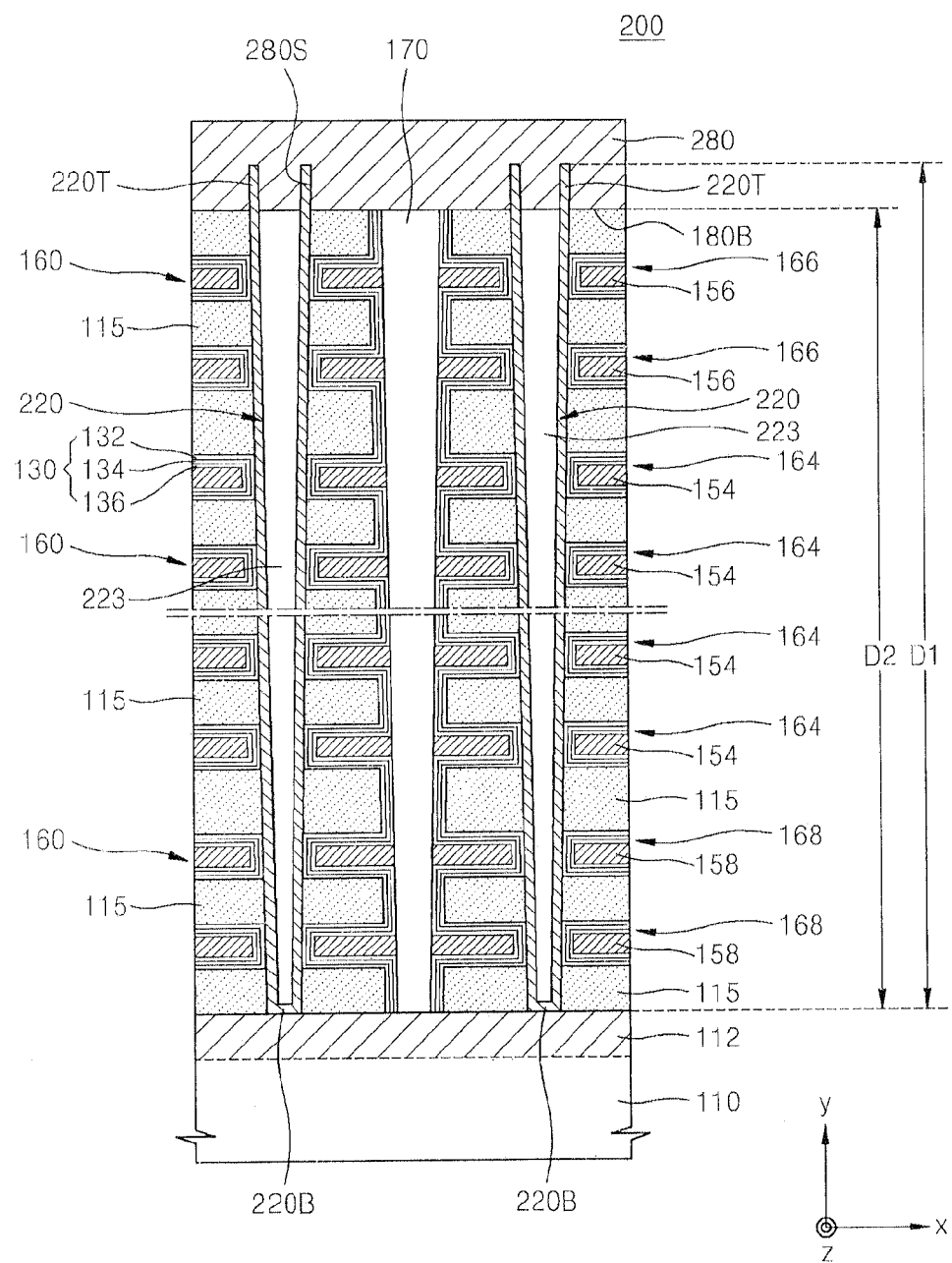
FIG. 6 is a cross-sectional view of a part of a flash memory device, according to an embodiment of the inventive concept.

FIG. 6 is a cross-sectional view of a part of a flash memory device 200, according to an embodiment of the inventive concept.

Like reference numerals in FIGS. 3 and 6 denote like elements.

The schematic structure of the flash memory device 200 is similar to that of the flash memory device 100 illustrated in FIG. 3. However, in the flash memory device 200, channel regions 220 have a ring-type pillar shape and are filled with insulation pillars 223.

The channel regions 220 are formed as semiconductor layers such as Si layers. Lower surfaces 220B of the channel regions 220 under the insulation pillars 223 contact portions of an upper surface of a substrate 110. Upper ends 220T of the channel regions 220 have a higher upper surface level than that of the insulation pillars 223 and protrude in a ring shape to a higher level than a top layer of interlayer dielectric layers 115.

A bit line 280 surrounds side walls and upper surfaces of the ring-shaped protrusions of the upper ends 220T of the channel regions 220 so as to directly contact the channel regions 220. Recesses 280S defining spaces corresponding to the ring-shaped protrusions of the upper ends 220T are formed in the bit line 280 so as to surround the ring-shaped protrusions. The recesses 280S of the bit line 280 may have a ring shape with respect to a lower surface 180B of the bit line 280.

Except for the above description, the structure of the bit line 280 is the same as that of the bit line 180 described above in relation to FIGS. 3, 4A, 4B, and 5A through 5G.

Figure 7A:
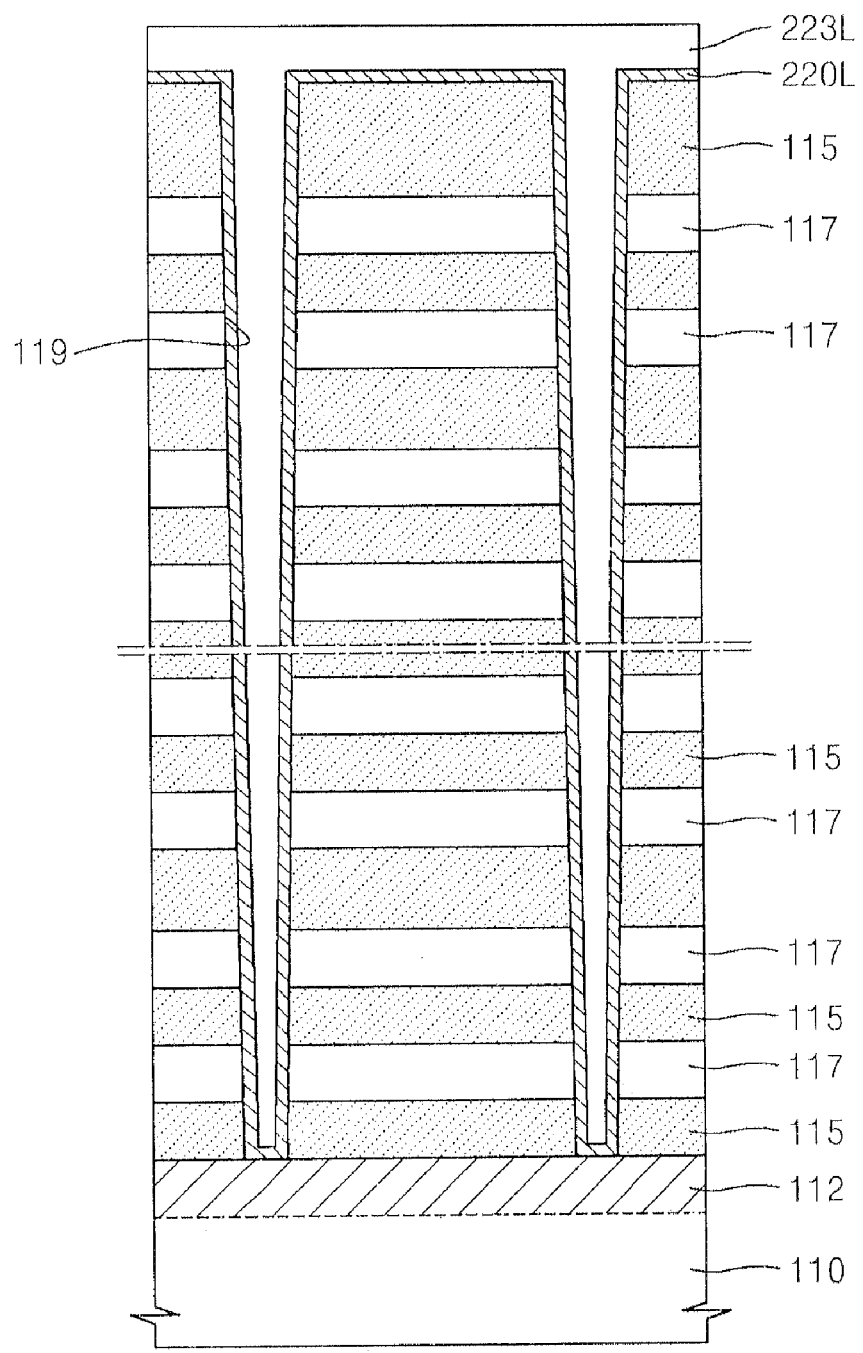
FIGS. 7A through 7C are sequential cross-sectional views for describing a method of manufacturing the flash memory device illustrated in FIG. 6, according to an embodiment of the inventive concept.
Figure 7B:
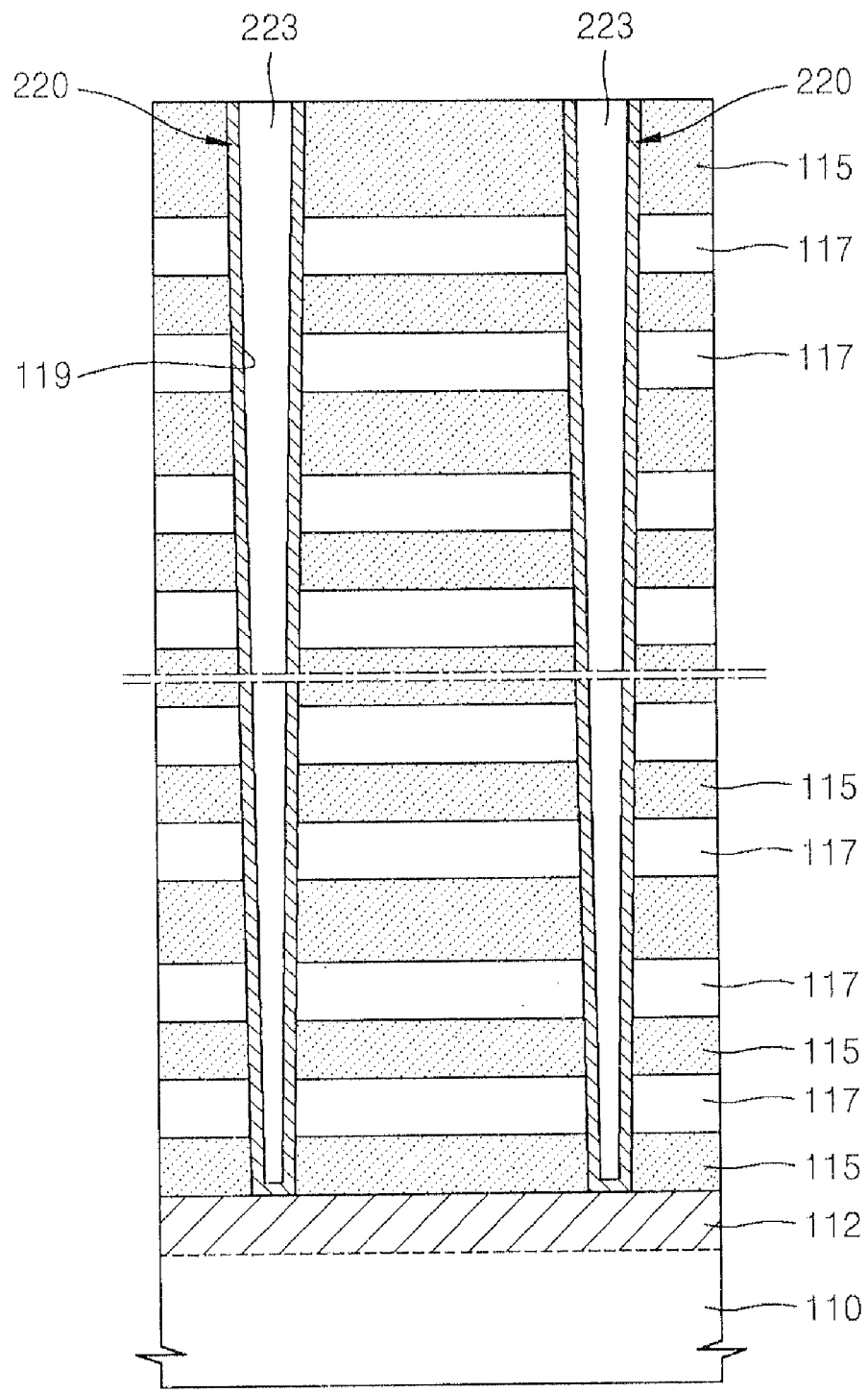
Figure 7C:
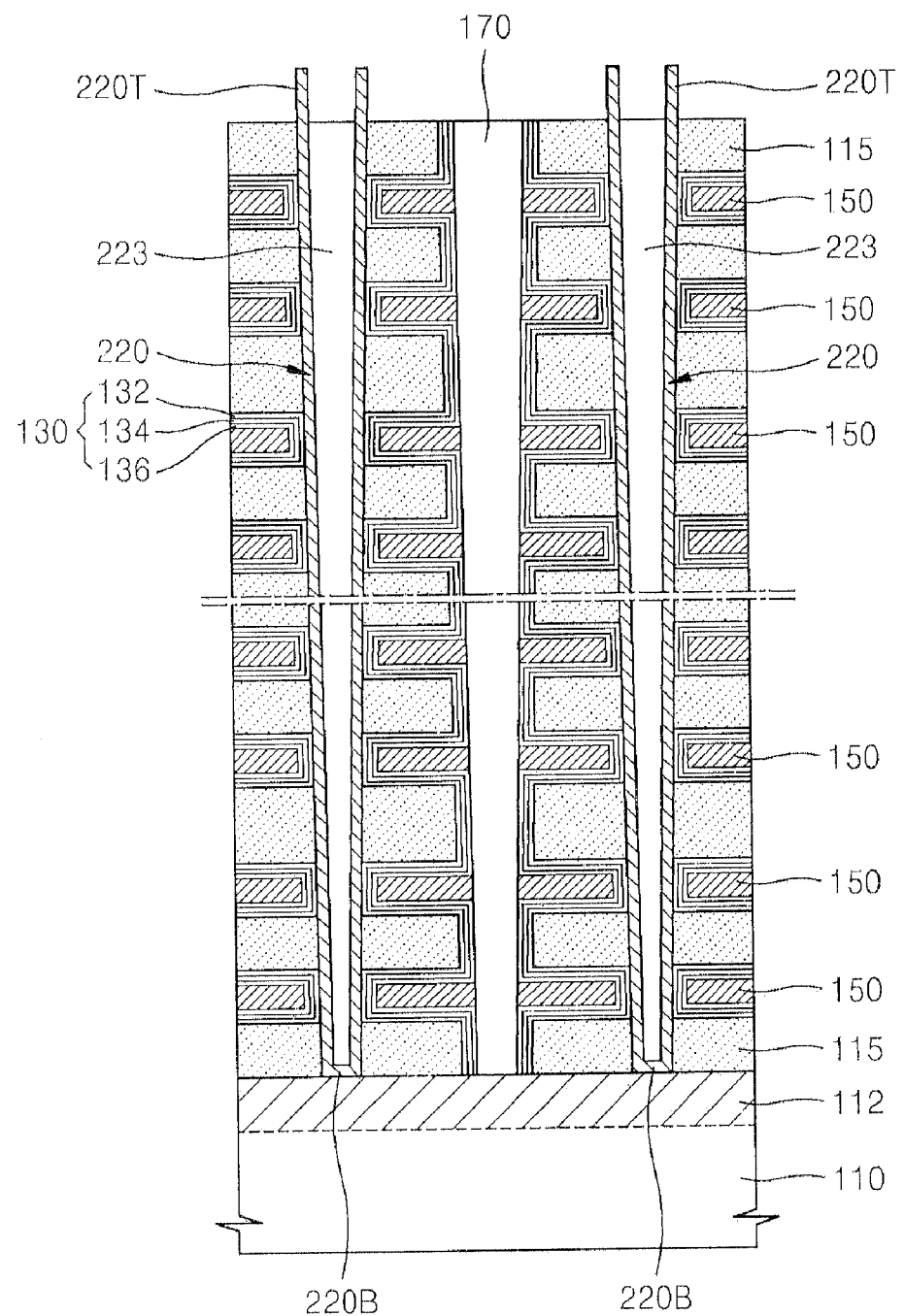

FIGS. 7A through 7C are sequential cross-sectional views for describing a method of manufacturing the flash memory device 200 illustrated in FIG. 6, according to an embodiment of the inventive concept.

Referring to FIG. 7A, as described above in relation to FIG. 5A, an impurity region 112 is formed in a substrate 110 and then interlayer dielectric layers 115 and sacrificial layers 117 are alternately stacked one-by-one on the substrate 110.

Then, as described above in relation to FIG. 5B, first holes 119 are formed by etching the interlayer dielectric layers 115 and the sacrificial layers 117. Then a channel layer 220L is formed on lower surfaces and side surfaces of the first holes 119 so as to contact portions of an upper surface of the substrate 110, which are exposed by the first holes 119. The channel layer 220L may be formed of Si. The channel layer 220L may also be formed as an Si epitaxial layer having a polycrystalline or monocrystalline structure.

Then, an insulating layer 223L is formed on the channel layer 220L so as to fill the remaining portion of the first holes 119. The insulating layer 223L may be formed by depositing an insulating material on the channel layer 220L so as to completely fill the first holes 119 and then performing an annealing process. The insulating layer 223L may be formed as an oxide film.

Referring to FIG. 7B, a CMP process or an etch-back process is performed on the insulating layer 223L so as to expose a portion of the channel layer 220L, which covers an upper surface of a top layer of the interlayer dielectric layers 115. Then, a CMP process or an etch-back process is performed again so as to remove the exposed portion of the channel layer 220L to expose the upper surface of the top layer of the interlayer dielectric layers 115. As a result, insulation pillars 223 and channel regions 220 having a ring-type pillar shape surrounding the insulation pillars 223 are formed in the first holes 119.

Referring to FIG. 7C, after performing a series of processes as described above in relation to FIGS. 5C through 5E, as described above in relation to FIG. 5F, under an etching condition in which etching of the channel regions 220 is suppressed, and gate dielectric layers 130, a top layer of interlayer dielectric layers 115, insulating layers 170, and the insulation pillars 223 have relatively high etch selectivities, the gate dielectric layers 130, the top layer of the interlayer dielectric layers 115, the insulating layers 170, and the insulation pillars 223 are selectively etched so as to be removed by a predetermined thickness to expose upper surfaces and side walls of upper ends 220T of the channel regions 220.

Then, as described above in relation to FIG. 5G, the bit line 280 illustrated in FIG. 6 is formed on the channel regions 220.

Figure 8:
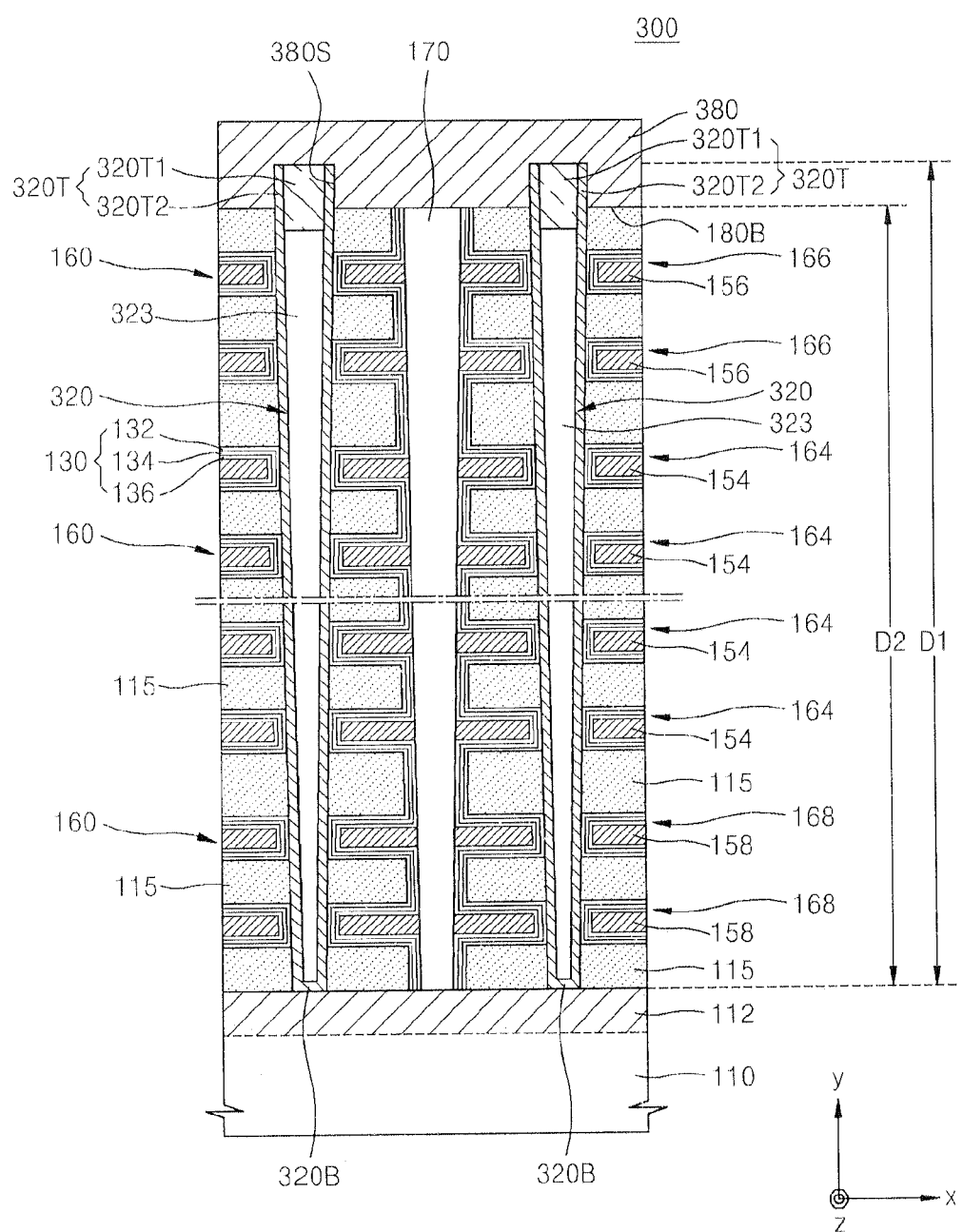
FIG. 8 is a cross-sectional view of a part of a flash memory device, according to an embodiment of the inventive concept.

FIG. 8 is a cross-sectional view of a part of a flash memory device 300, according to an embodiment of the inventive concept.

Like reference numerals in FIGS. 3, 6, and 8 denote like elements.

The schematic structure of the flash memory device 300 is similar to that of the flash memory device 200 illustrated in FIG. 6. In the flash memory device 300, channel regions 320 have a ring-type pillar shape and are filled with insulation pillars 323. Also, upper ends 320T of the channel regions 320 include first upper ends 320T1 covering upper surfaces of the insulation pillars 323, and second upper ends 320T2 surrounding the first upper ends 320T1 in a ring-type pillar shape. The insulation pillars 323 are completely surrounded by the channel regions 320. The upper ends 320T of the channel regions 320 may be doped with impurities.

The first and second upper ends 320T1 and 320T2 are exposed on upper surfaces thereof. The upper ends 320T of the channel regions 320 have a higher upper surface level than that of the insulation pillars 323 and protrude to a higher level than a top layer of interlayer dielectric layers 115.

The channel regions 320 may be formed as semiconductor layers such as Si layers. Lower surfaces 320B of the channel regions 320 under the insulation pillars 323 contact portions of an upper surface of a substrate 110.

A bit line 380 is formed at the upper ends 320T of the channel regions 320 to surround the first and second upper ends 320T1 and 320T2 of the channel regions 320. That is, the bit line 380 surrounds side walls and upper surfaces of pillar-shaped protrusions of the upper ends 320T of the channel regions 320, which include the first and second upper ends 320T1 and 320T2, so as to directly contact the channel regions 320. Recesses 380S defining spaces corresponding to the pillar-shaped protrusions of the upper ends 320T are formed in the bit line 380 so as to surround the pillar-shaped protrusions.

Except for the above description, the structure of the bit line 380 is the same as that of the bit line 180 described above in relation to FIGS. 3, 4A, 4B, and 5A through 5G.

FIGS. 9A through 9D are sequential cross-sectional views for describing a method of manufacturing the flash memory device 300 illustrated in FIG. 8, according to an embodiment of the inventive concept.

Figure 9A:
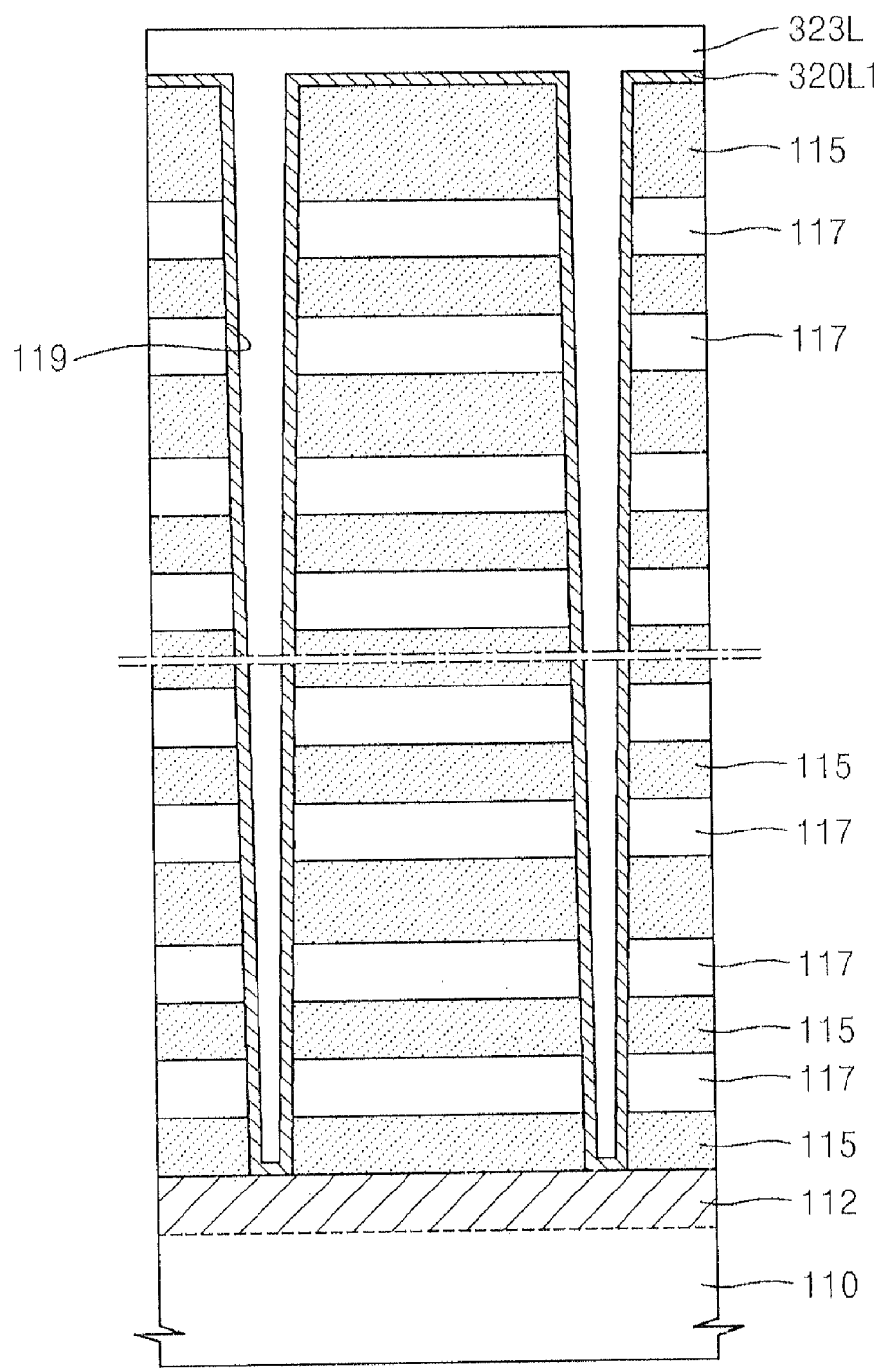
FIGS. 9A through 9D are sequential cross-sectional views for describing a method of manufacturing the flash memory device illustrated in FIG. 8, according to an embodiment of the inventive concept.

Referring to FIG. 9A, as described above in relation to FIG. 7A, an impurity region 112 is formed in a substrate 110, interlayer dielectric layers 115 and sacrificial layers 117 are alternately stacked one-by-one on the substrate 110, and then first holes 119 are formed by etching the interlayer dielectric layers 115 and the sacrificial layers 117. Then, a first channel layer 320L1 is formed on lower surfaces and side surfaces of the first holes 119. The description of the first channel layer 320L1 is the same as that of the channel layer 220L illustrated in FIG. 7A.

An insulating layer 323L is formed on the first channel layer 320L1 so as to fill the remaining portion of the first holes 119. The description of the insulating layer 323L is the same as that of the insulating layer 223L illustrated in FIG. 7A.

Figure 9B:
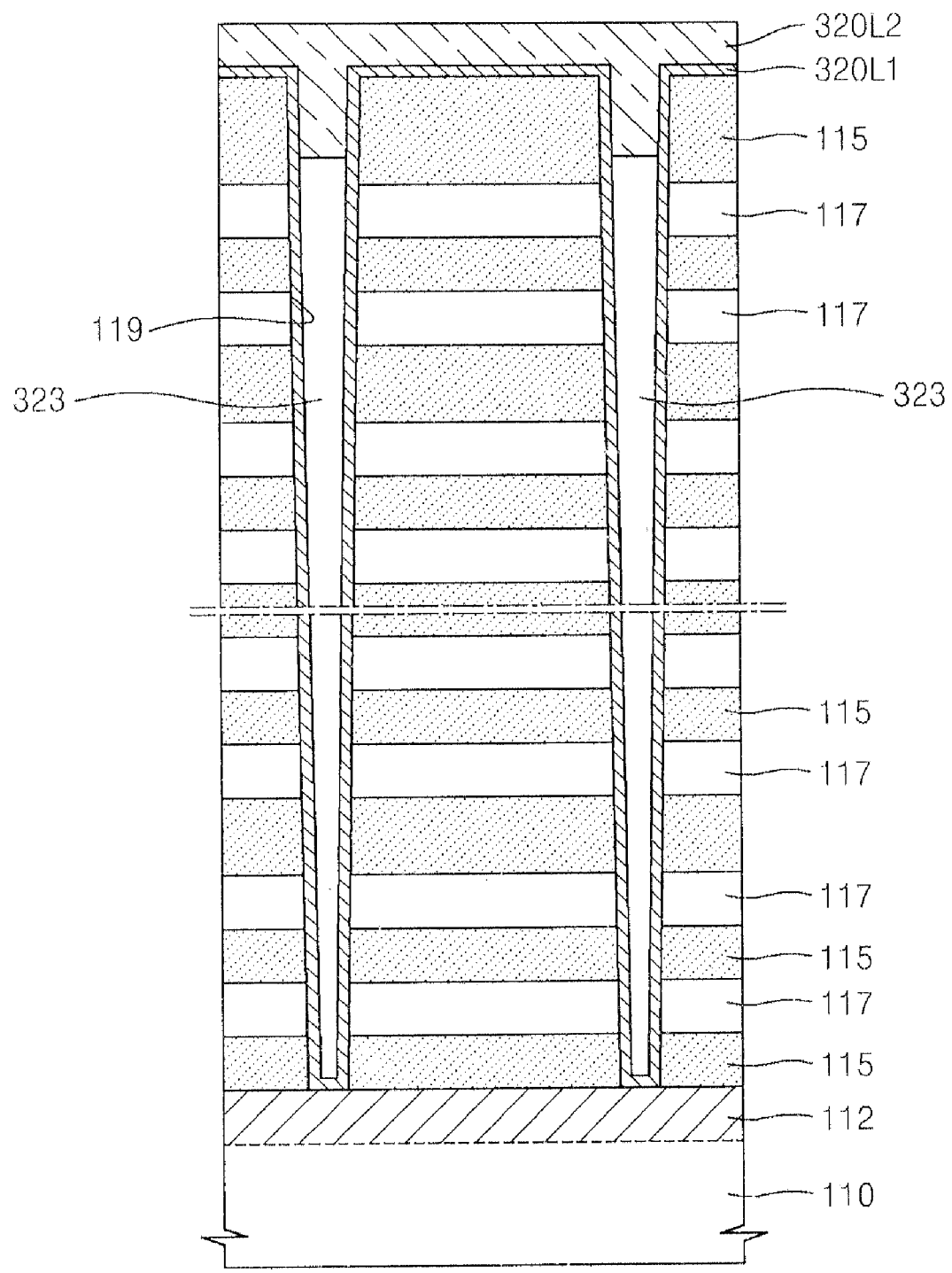

Referring to FIG. 9B, a CMP process or an etch-back process is performed on the insulating layer 323L so as to form insulation pillars 323 having an upper surface level lower than that of the first channel layer 320L1. As a result, internal walls of the first channel layer 320L1 above the upper surface of the insulation pillars 323 are exposed.

Then, a second channel layer 320L2 is formed on the insulation pillars 323 and the first channel layer 320L1 so as to fill the remaining portion of the first holes 119 on the insulation pillars 323. The second channel layer 320L2 may be formed as a semiconductor layer such as an Si layer.

Figure 9C:
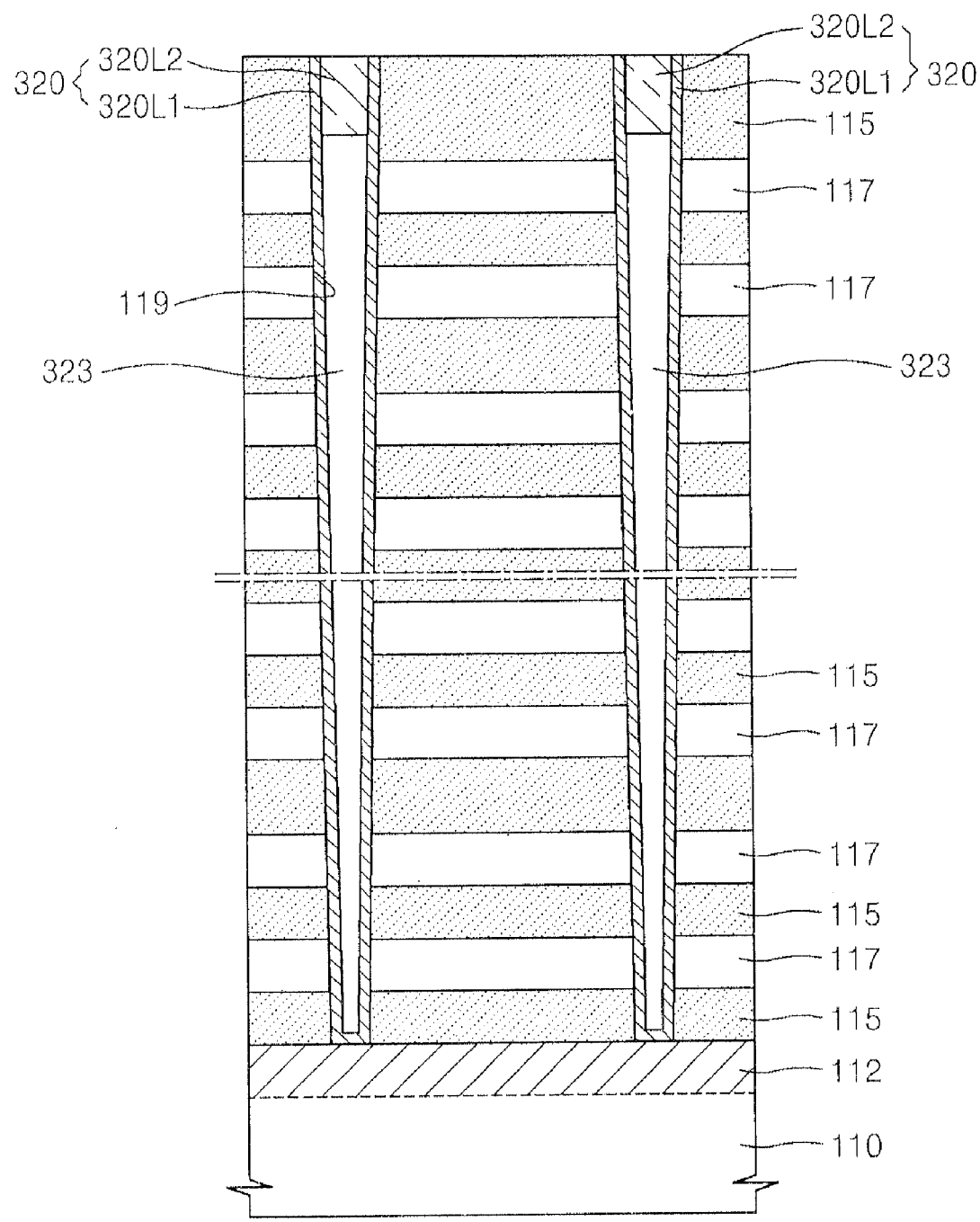

Referring to FIG. 9C, a CMP process or an etch-back process is performed so as to remove an upper portion of the second channel layer 320L2 and a portion of the first channel layer 320L1, which cover an upper surface of a top layer of the interlayer dielectric layers 115. As a result, the upper surface of the top layer of the interlayer dielectric layers 115 is exposed. As a result, the first and second channel layers 320L1 and 320L2 remaining in the first holes 119 form channel regions 320.

Figure 9D:
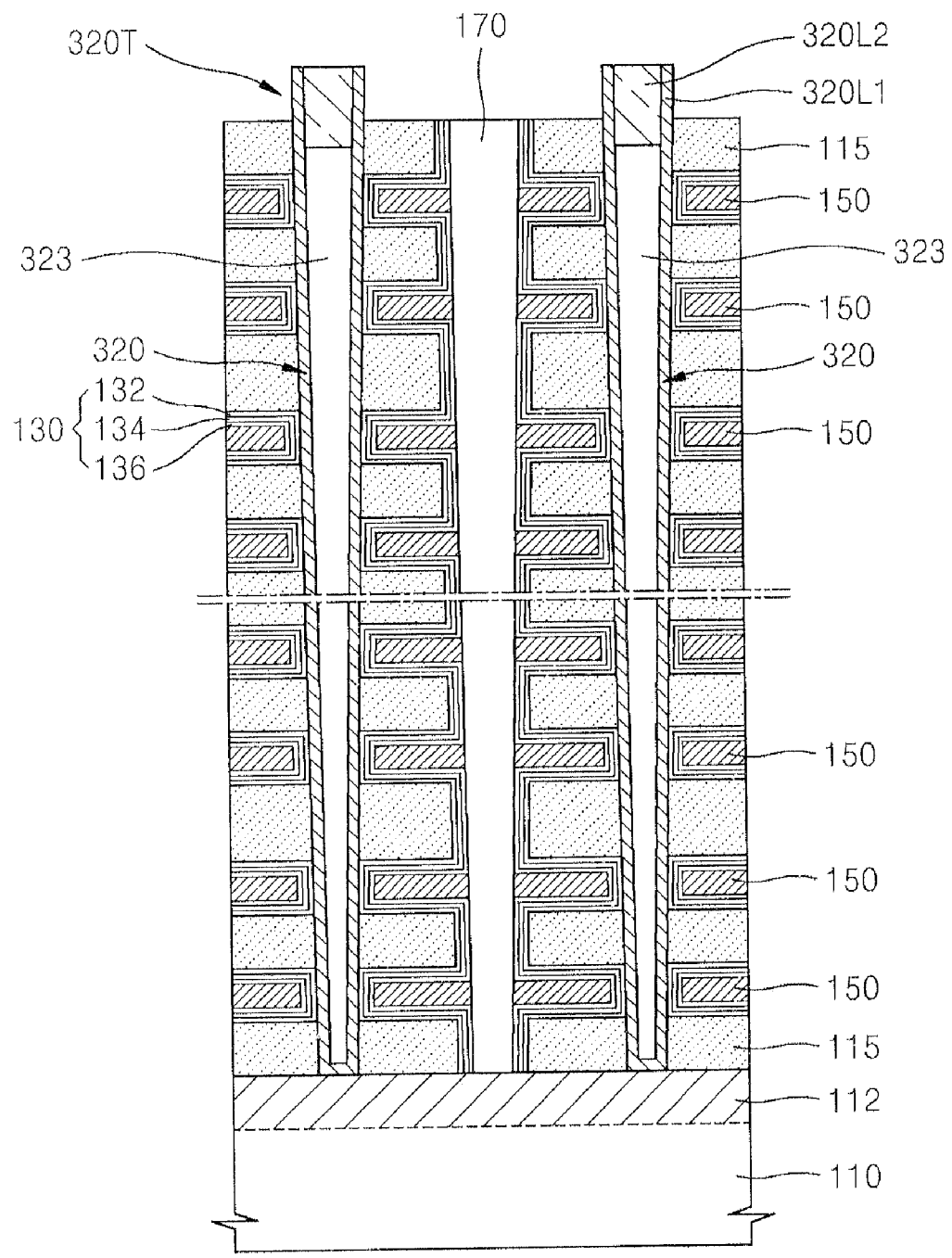

Referring to FIG. 9D, after performing a series of processes described above in relation to FIGS. 5C through 5E, as described above in relation to FIGS. 5F and 7C, under an etching condition in which etching of the channel regions 320 is suppressed, and gate dielectric layers 130, a top layer of interlayer dielectric layers 115, and insulating layers 170 have relatively high etch selectivities, the gate dielectric layers 130, the top layer of the interlayer dielectric layers 115, and the insulating layers 170 are selectively etched so as to be removed by a predetermined thickness to expose upper surfaces and side walls of upper ends 320T of the channel regions 320.

The upper ends 320T of the channel regions 320 may be doped with impurities. The process for doping the upper ends 320T of the channel regions 320 with impurities may be performed after the above processes are performed or may be performed in-between the above processes, if necessary. Alternatively, the second channel layer 320L2 may be formed as an impurity-doped polysilicon layer.

Then, as described above in relation to FIG. 5G, the bit line 380 illustrated in FIG. 8 is formed on the channel regions 320.

Figure 10:
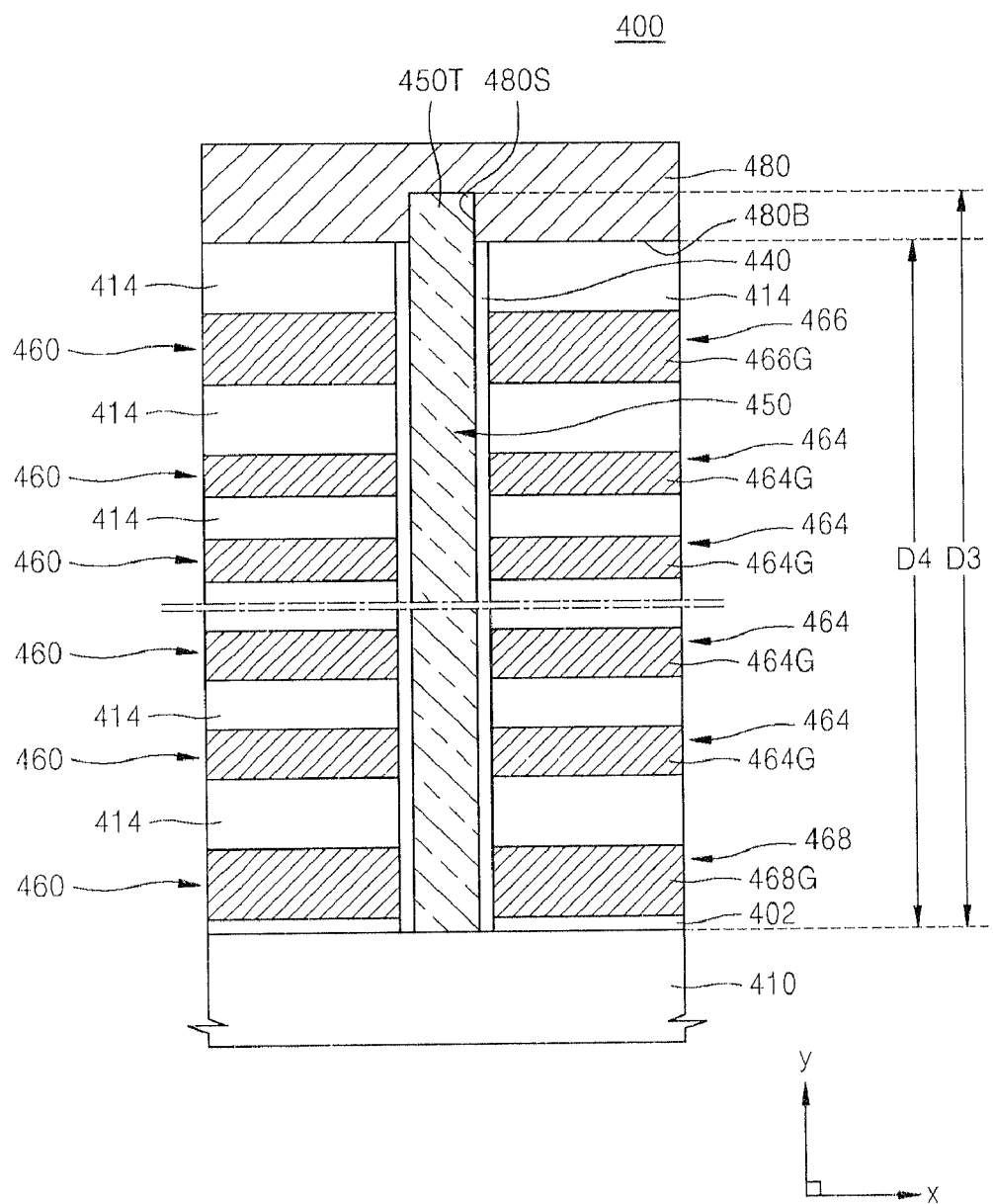
FIG. 10 is a cross-sectional view of a part of a flash memory device, according to an embodiment of the inventive concept.

FIG. 10 is a cross-sectional view of a part of a flash memory device 400, according to an embodiment of the inventive concept.

Referring to FIG. 10, the flash memory device 400 may include a substrate 410 having a main surface that extends in a first direction (the x direction). The description of the substrate 410 is the same as that of the substrate 110 illustrated in FIG. 3.

A channel region 450 in a pillar shape extends from the substrate 410 in a second direction (the y direction) that is perpendicular to the first direction.

A gate dielectric layer 440 is formed around the channel region 450.

A plurality of transistors 460 are sequentially formed around the channel region 450 in the second direction from an upper surface of the substrate 410. One channel region 450 and a plurality of transistors 460 formed around the channel region 450 in an elongated direction of the channel region 450 form one memory cell string (see 11 of FIG. 1).

The one memory cell string includes first transistors 464 forming a plurality of memory cells, a second transistor 466 functioning as a string selection transistor, and a third transistor 468 functioning as a ground selection transistor.

A bit line 480 is connected to second transistors 466 via a top layer of the interlayer dielectric layers 414. The bit line 480 may be formed in a linear pattern that extends in the first direction.

The bit line 480 surrounds a side wall and an upper surface of one end of the channel region 450, which is far from the substrate 410, i.e., an upper end 450T of the channel region 450, so as to directly contact the channel region 450.

The upper surface of the upper end 450T of the channel region 450 is spaced apart from the substrate 410 by a first distance D3, and a lower surface 480B of the bit line 480, which is closer to the substrate 410 than the upper surface of the upper end 450T, is spaced apart from the substrate 410 by a second distance D4. The second distance D4 is less than the first distance D3. For example, a difference between the first and second distances D3 and D4 may be equal to or greater than about 10 nm.

In FIG. 10, the upper end 450T of the channel region 450 is formed as a pillar-shaped protrusion covered by the bit line 480, and a recess 480S defining a space corresponding to the pillar-shaped protrusion is formed in the bit line 480 so as to surround the pillar-shaped protrusion.

Although one channel region 450 is formed on the substrate 410 in FIG. 10, a plurality of channel regions 450 may be formed on the substrate 410. Also, a plurality of memory cell strings (see 11 of FIG. 1) may be formed around the channel regions 450.

The first transistors 464 include the gate dielectric layer 440 formed around a side wall of the channel region 450, and control gate electrodes 464G formed around the channel region 450, wherein the gate dielectric layer 440 is disposed between the control gate electrodes 464G and the channel region 450.

The second transistor 466 includes the gate dielectric layer 440 formed around the side wall of the channel region 450, and a gate electrode 466G formed around the channel region 450, wherein the gate dielectric layer 440 is disposed between the gate electrode 466G and the channel region 450. The third transistor 468 includes the gate dielectric layer 440 formed around the side wall of the channel region 450, and a gate electrode 468G formed around the channel region 450, wherein the gate dielectric layer 440 is disposed between the gate electrode 468G and the channel region 450.

The description of the gate dielectric layer 440 is substantially the same as that of one of the gate dielectric layers 130 illustrated in FIG. 3.

Interlayer dielectric layers 414 are disposed around the channel region 450 and between the first, second, and third transistors 464, 466, and 468. In FIG. 10, reference numeral 402 represents an insulating layer.

FIGS. 11A through 11F are sequential cross-sectional views for describing a method of manufacturing the flash memory device 400 illustrated in FIG. 10, according to an embodiment of the inventive concept.

Figure 11A:
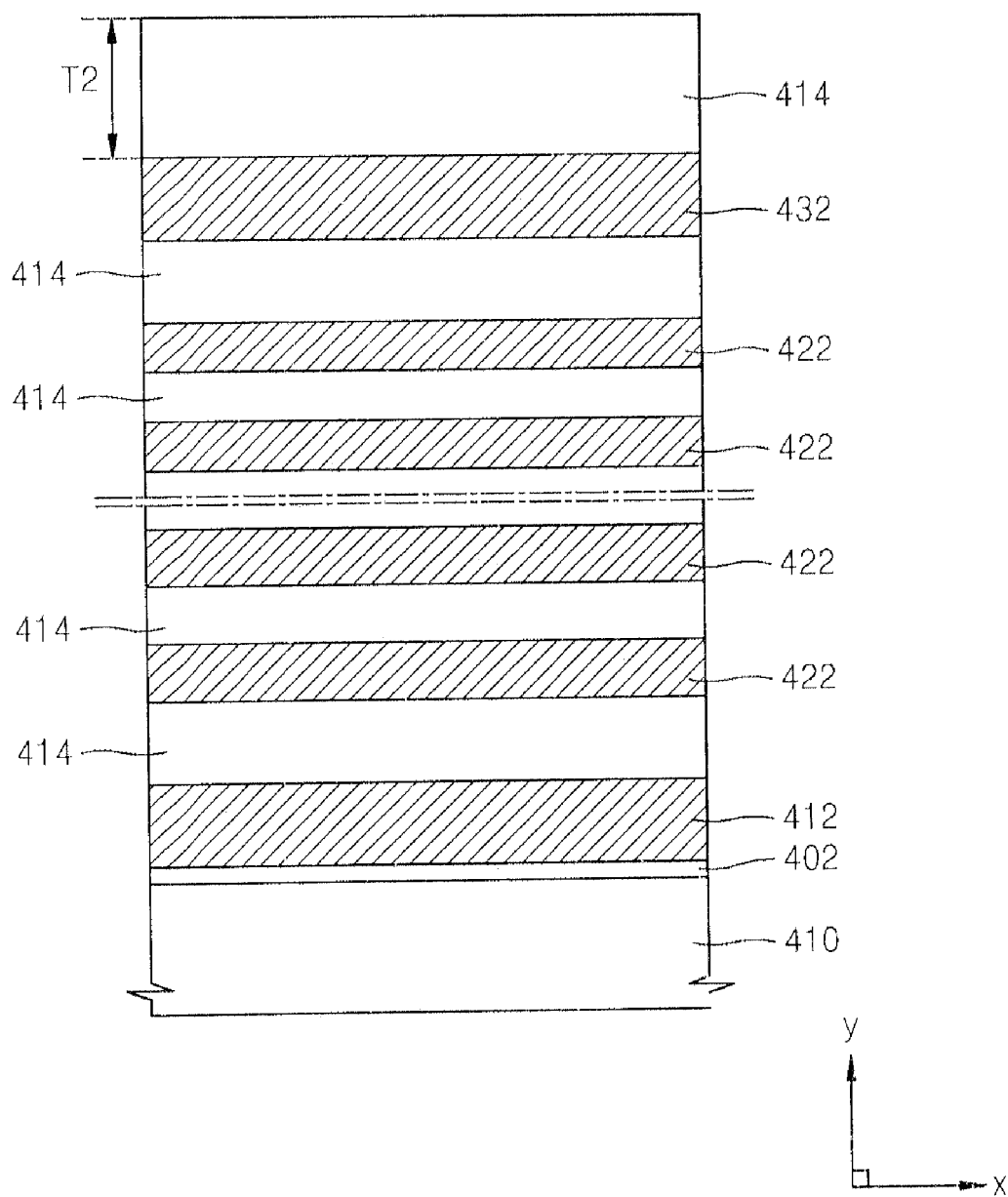
FIGS. 11A through 11F are sequential cross-sectional views for describing a method of manufacturing the flash memory device illustrated in FIG. 10, according to an embodiment of the inventive concept.

Referring to FIG. 11A, an insulating layer 402 is formed on a semiconductor substrate 410. Then, a first gate layer 412 is formed on the insulating layer 402 in order to form the third transistor 468. Then, a plurality of interlayer dielectric layers 414 and a plurality of second gate layers 422 are alternately stacked one-by-one on the first gate layer 412. Then, a third gate layer 432 is formed on the interlayer dielectric layer 414 covering the uppermost second gate layer 422, in order to form the second transistor 466. The third gate layer 432 is covered by a top layer of the interlayer dielectric layers 414.

Each of the first gate layer 412, the second gate layers 422, and the third gate layer 432 may be formed of polysilicon or a metal having a high melting point. The interlayer dielectric layers 414 may be formed as oxide films or low-dielectric films.

The top layer of the interlayer dielectric layers 414 has a thickness T2 greater than thicknesses of the other lower interlayer dielectric layers 414.

The number of second gate layers 422 may vary according to the structure of a memory device to be formed. As the number of second gate layers 422 increases, the number of memory cells in a unit area also increases.

Figure 11B:
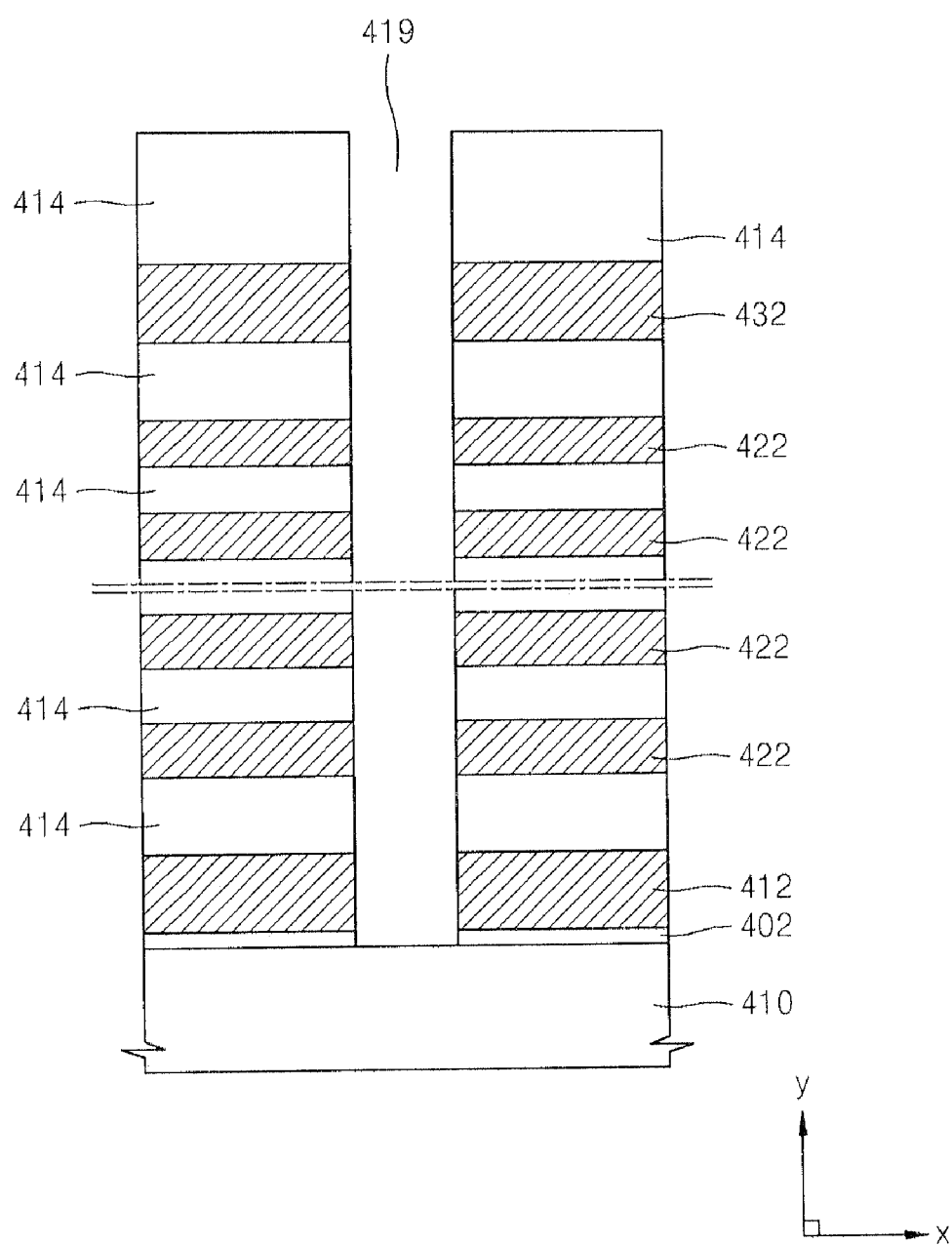

Referring to FIG. 11B, the interlayer dielectric layers 414, the insulating layer 402, the first gate layer 412, the second gate layers 422, and the third gate layer 432 are sequentially etched by using a photolithography process so as to form a first hole 419 exposing a portion of an upper surface of the substrate 410.

Figure 11C:
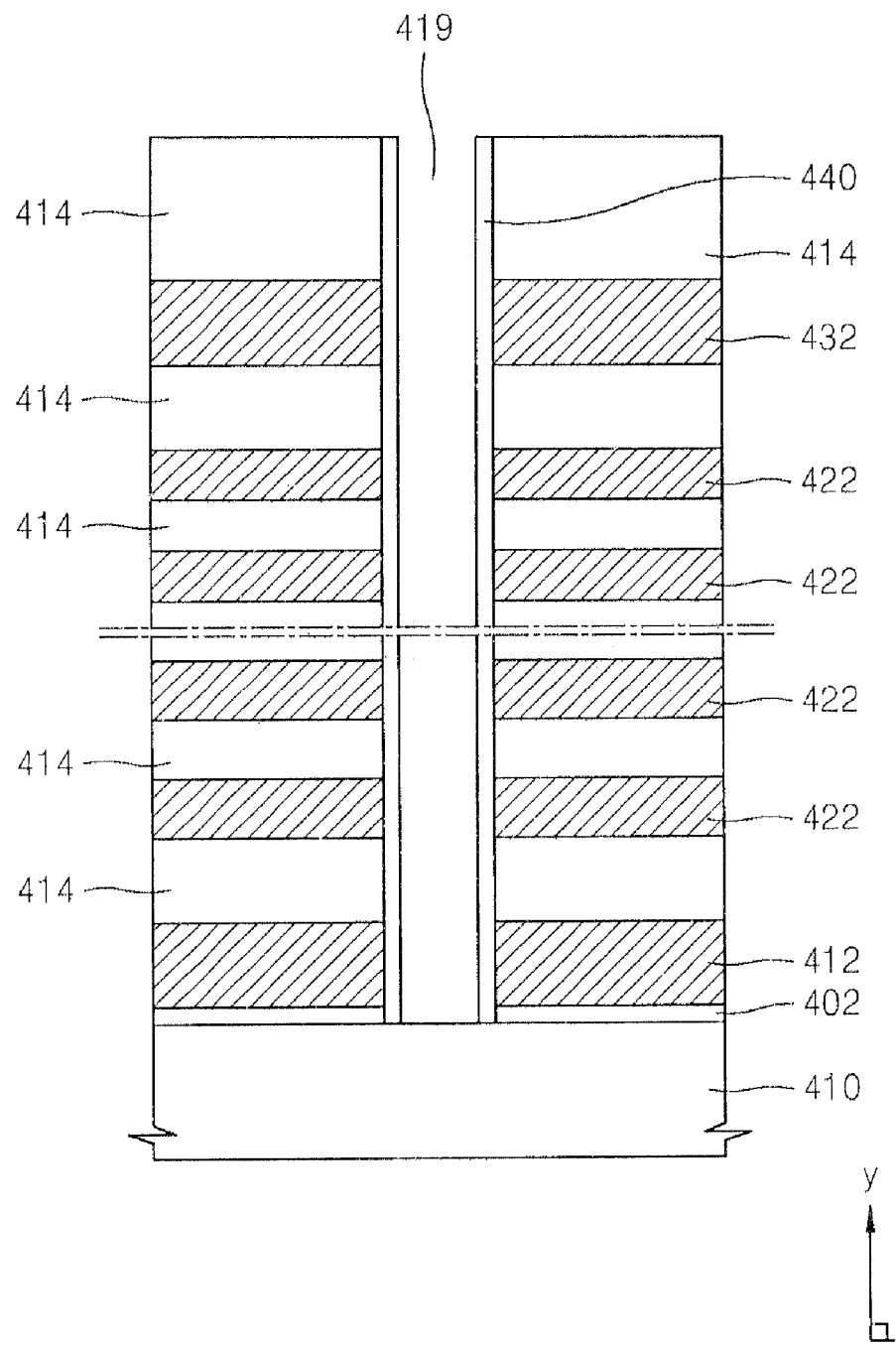

Referring to FIG. 11C, a gate dielectric layer 440 is formed on an internal wall of the first hole 419 and the exposed portion of the upper surface of the substrate 410. A portion of the gate dielectric layer 440, which covers the exposed portion of the upper surface of the substrate 410, is removed, and thus the gate dielectric layer 440 remains only on the side wall of the first hole 419 and part of the upper surface of the substrate 410 corresponding to a thickness of the gate dielectric layer 440. The remaining description of the gate dielectric layer 440 is substantially the same as that of the gate dielectric layers 130 illustrated in FIG. 5E.

Figure 11D:
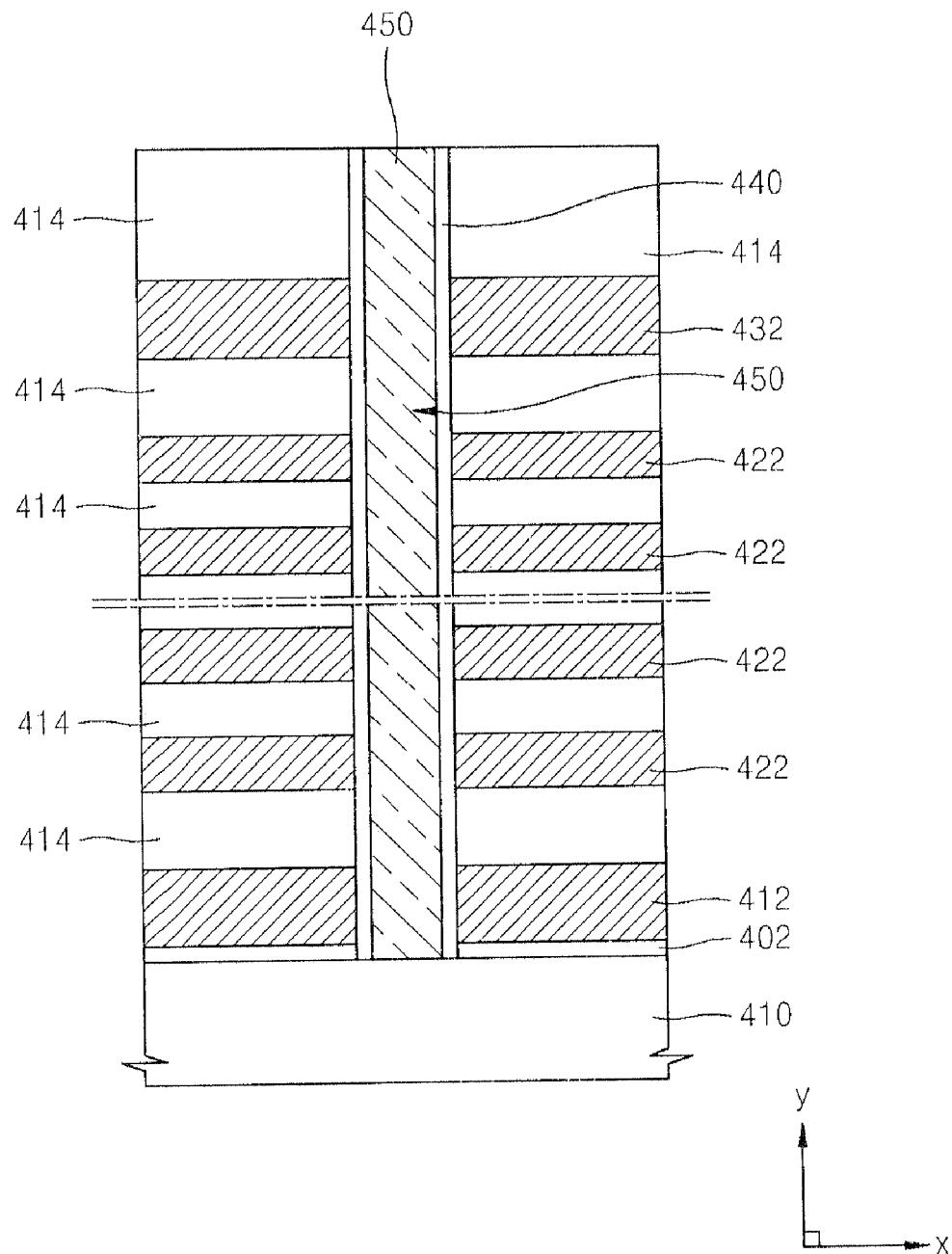

Referring to FIG. 11D, as described above in relation to FIG. 5B, the first hole 419 is filled with a semiconductor material. A CMP process or an etch-back process is performed until an upper surface of the top layer of the interlayer dielectric layers 414 is exposed to remove the semiconductor material remaining on the top layer of the interlayer dielectric layers 414, thereby forming a pillar-shaped channel region 450 filling in the first hole 419. For example, the channel region 450 may be formed of Si. The channel region 450 may also be formed as an Si epitaxial layer having a polycrystalline or monocrystalline structure.

Figure 11E:
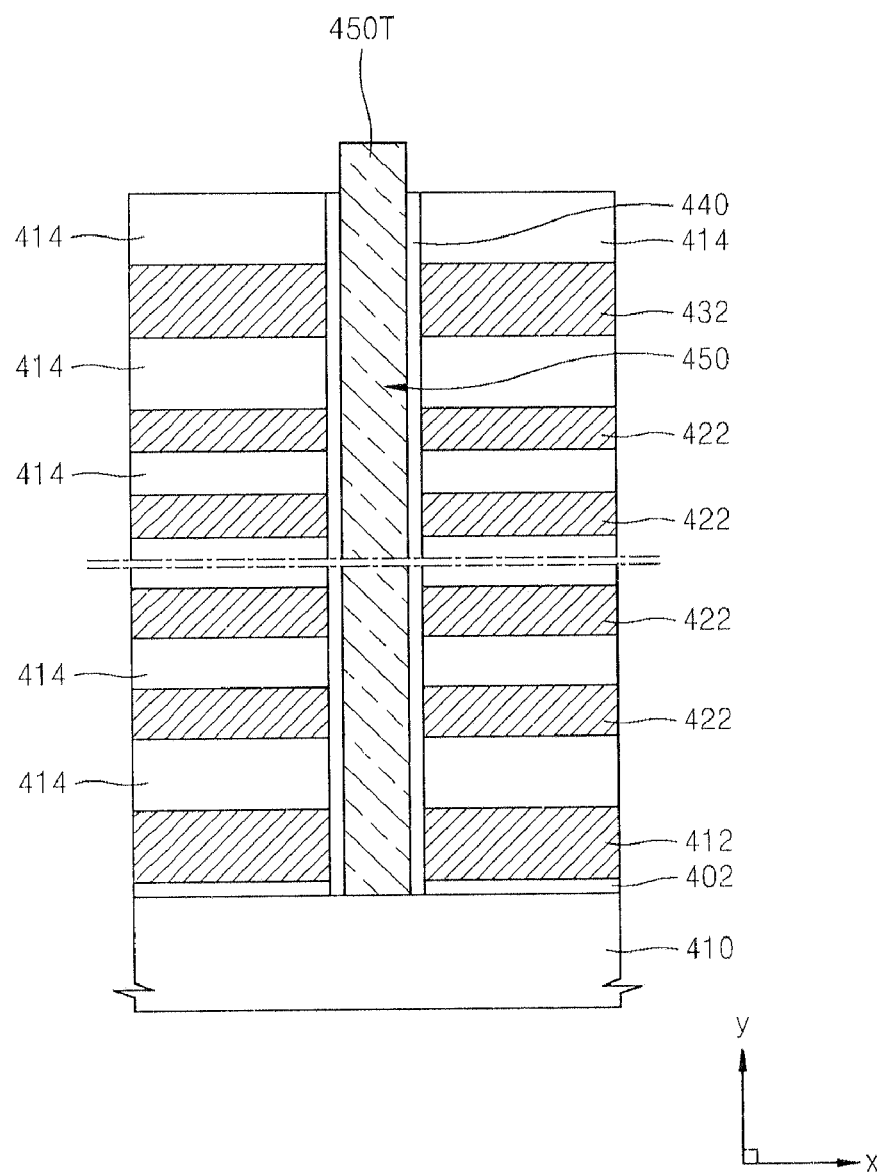

Referring to FIG. 11E, as described above in relation to FIG. 5F, under an etching condition in which etching of the channel region 450 is suppressed, and the gate dielectric layer 440 and the top layer of the interlayer dielectric layers 414 have relatively high etch selectivities, the gate dielectric layer 440 and the top layer of the interlayer dielectric layers 414 are selectively etched so as to be removed by a predetermined thickness to expose an upper surface and a side wall of an upper end 450T of the channel region 450.

Figure 11F:
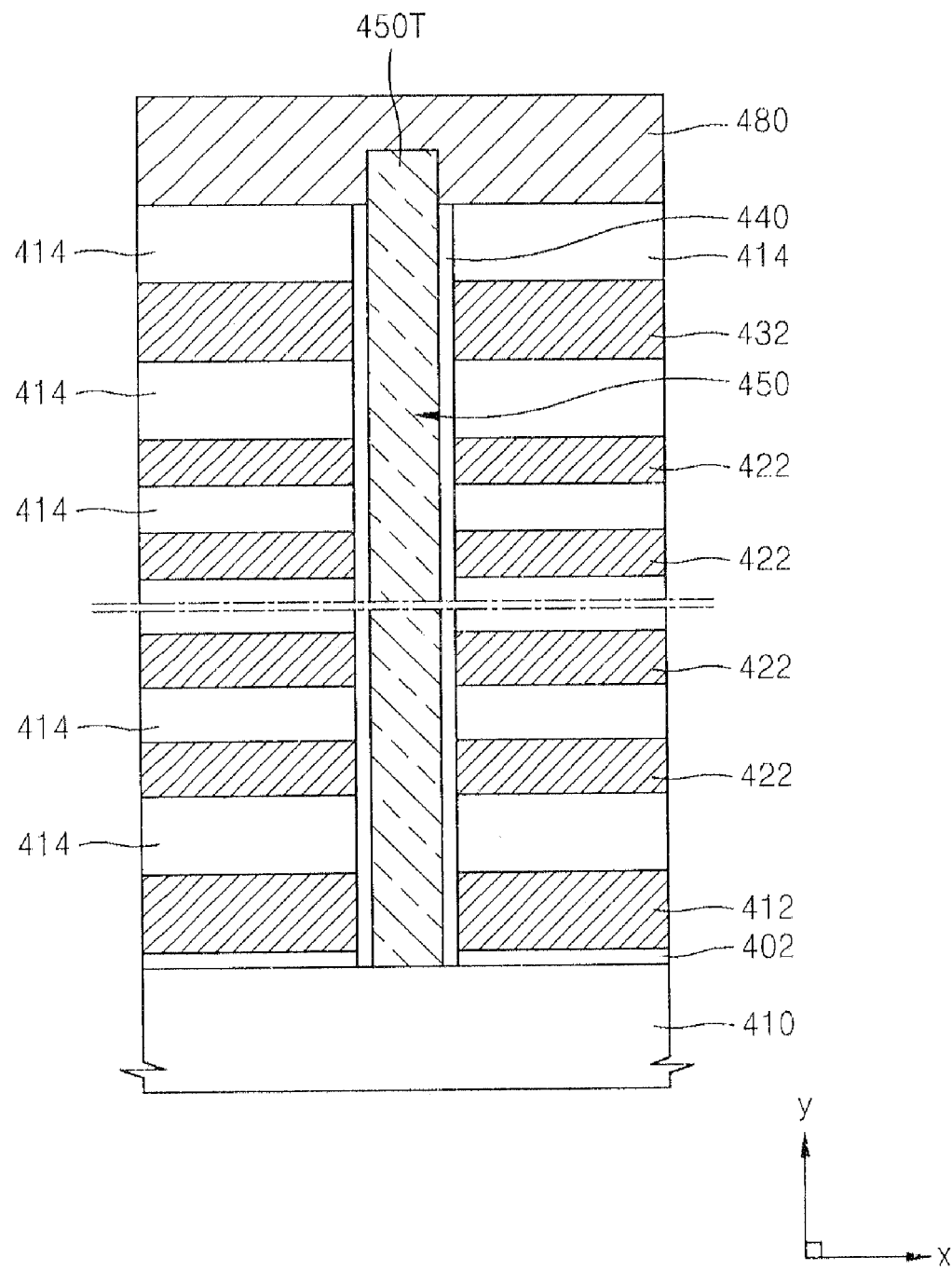

Referring to FIG. 11F, a bit line 480 is formed on the channel region 450 so as to surround the side wall and the upper surface of the upper end 450T of the channel region 450 and directly contact the channel region 450. The bit line 480 may be formed by using the above-described method of forming the bit lines 180 illustrated in FIG. 5G.

In FIG. 11F, the first gate layer 412, the second gate layers 422, and the third gate layer 432 respectively correspond to the gate electrode 468G, the control gate electrodes 464G, and the gate electrode 466G illustrated in FIG. 10.

Figure 12:
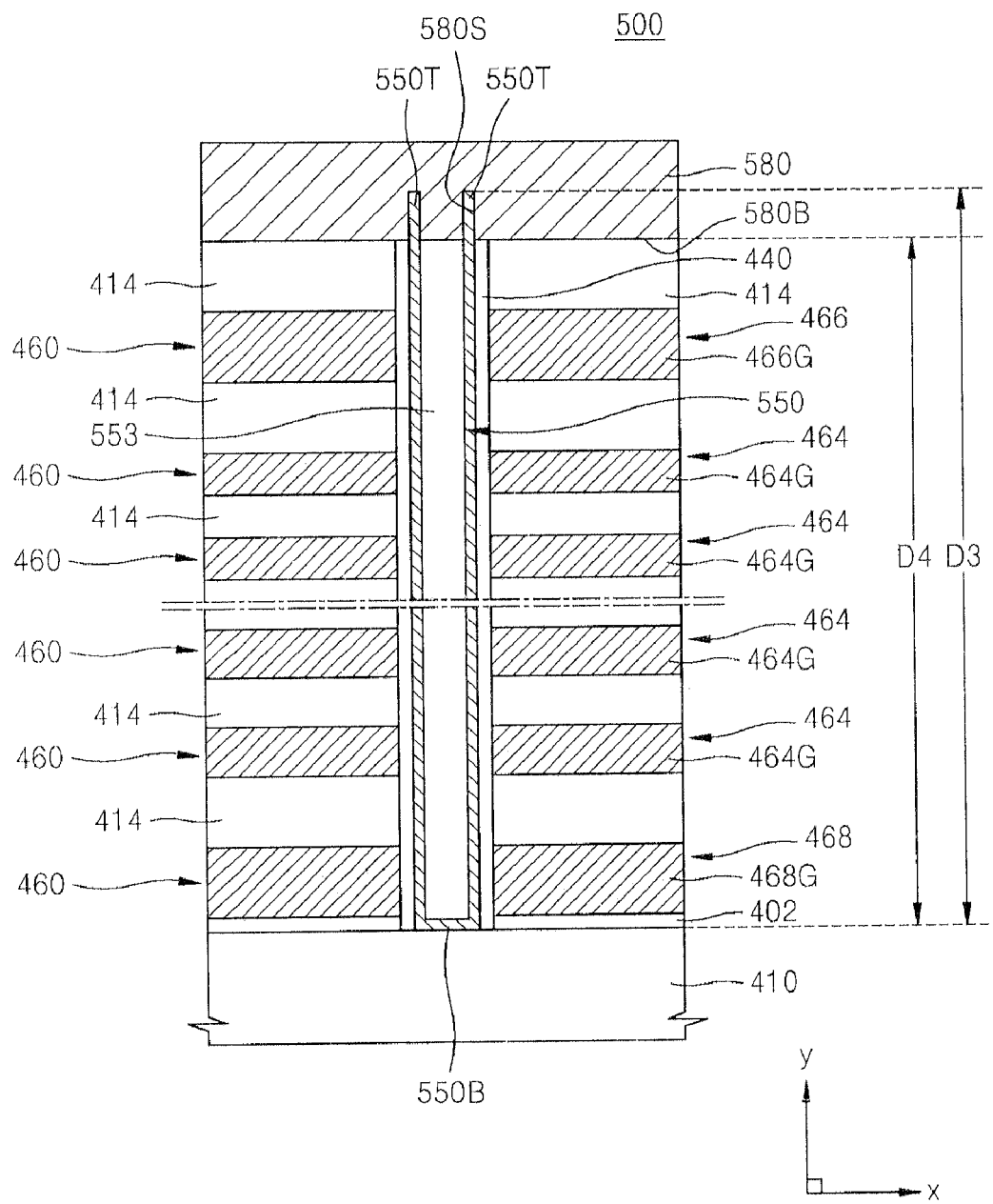
FIG. 12 is a cross-sectional view of a part of a flash memory device, according to an embodiment of the inventive concept.

FIG. 12 is a cross-sectional view of a part of a flash memory device 500, according to another embodiment of the inventive concept.

Like reference numerals in FIGS. 10 and 12 denote like elements.

The schematic structure of the flash memory device 500 is similar to that of the flash memory device 400 illustrated in FIG. 10. However, in the flash memory device 500, a channel region 550 has a ring-type pillar shape and is filled with an insulation pillar 553.

The channel region 550 may be formed as a semiconductor layer such as an Si layer. A lower surface 550B of the channel region 550 under the insulation pillar 553 contacts a portion of an upper surface of a substrate 410. An upper end 550T of the channel region 550 has an upper surface level higher than that of the insulation pillar 553 and protrudes in a ring shape to a higher level than a top layer of interlayer dielectric layers 414.

A bit line 580 surrounds a side wall and an upper surface of a ring-shaped protrusion of the upper end 550T of the channel region 550 so as to directly contact the channel region 550. A recess 580S defining a space corresponding to the ring-shaped protrusion of the upper end 550T is formed in the bit line 580 so as to surround the ring-shaped protrusion.

Except for the above description, the structure of the bit line 580 is the same as that of the bit line 180 described above in relation to FIGS. 3, 4A, 4B, and 5A through 5G.

Figure 13A:
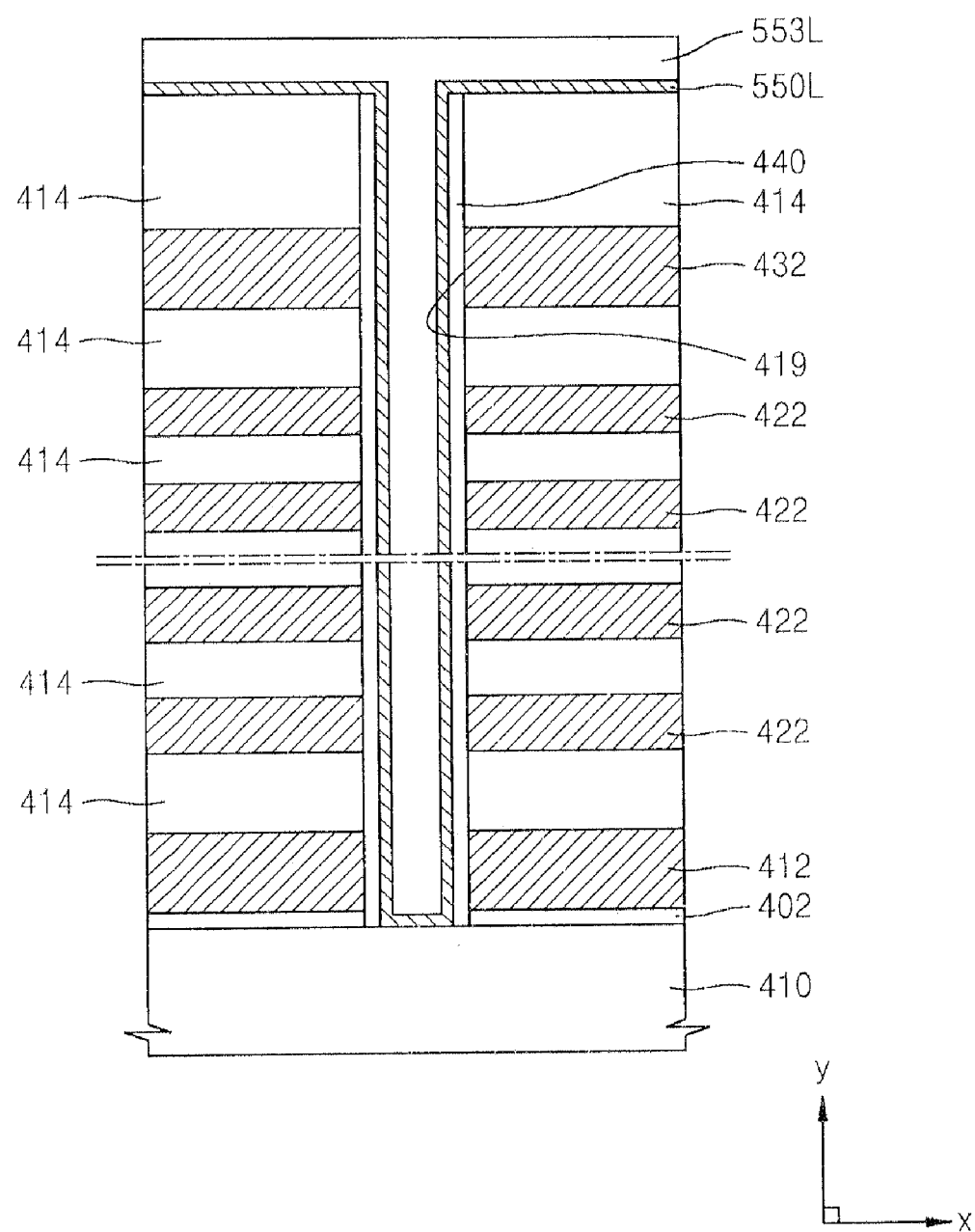
FIGS. 13A through 13C are sequential cross-sectional views for describing a method of manufacturing the flash memory device illustrated in FIG. 12, according to an embodiment of the inventive concept.
Figure 13B:
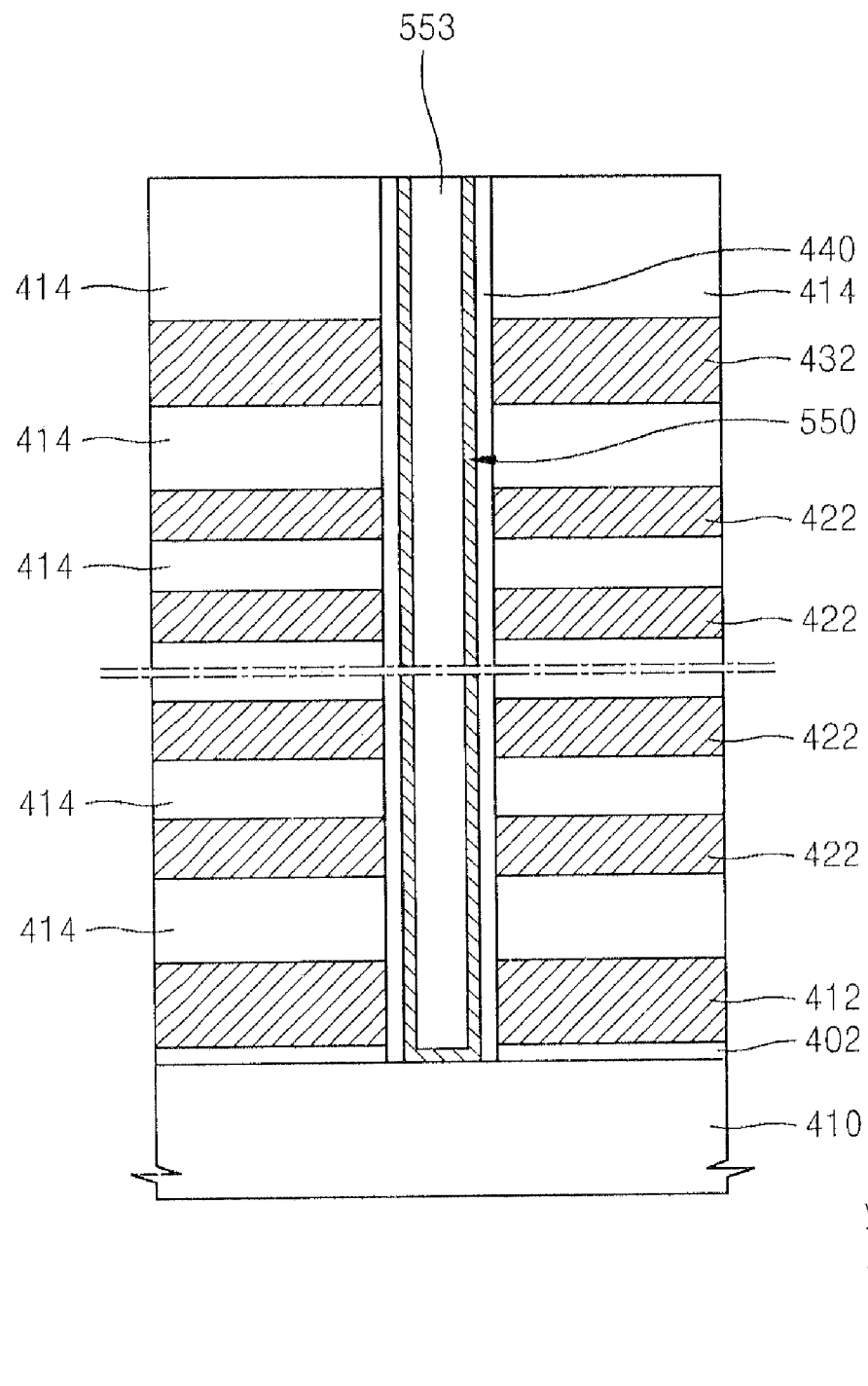
Figure 13C:
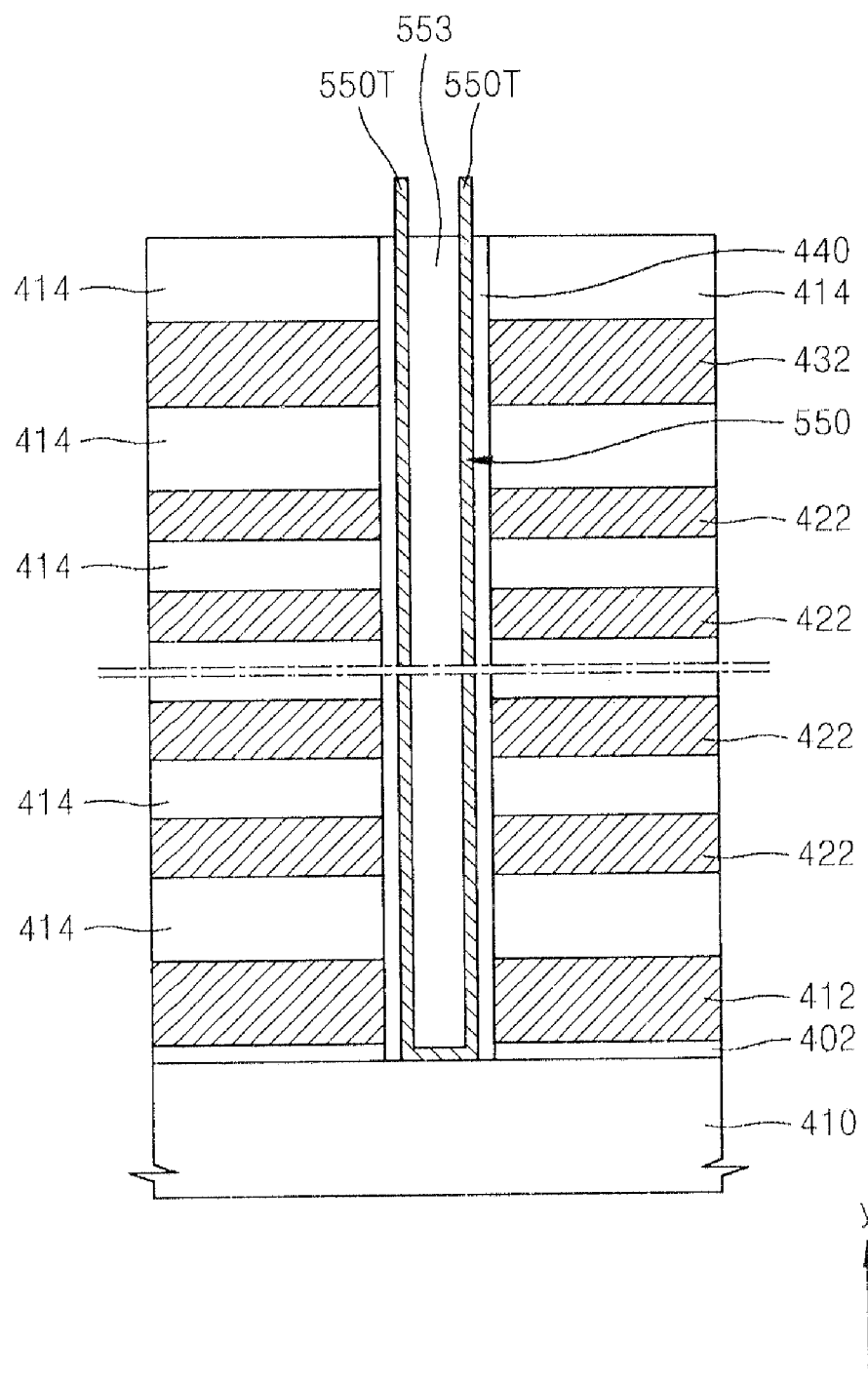

FIGS. 13A through 13C are sequential cross-sectional views for describing a method of manufacturing the flash memory device 500 illustrated in FIG. 12, according to an embodiment of the inventive concept.

Referring to FIG. 13A, as described above in relation to FIGS. 11A through 11C, the same processes are performed until a gate dielectric layer 440 is formed on a substrate 410.

Then, a channel layer 550L is formed on a lower surface and a side surface of a first hole 419 so as to contact a portion of an upper surface of the substrate 410, which is exposed by the first hole 419. The channel layer 550L may be formed of Si. The channel layer 550L may also be formed as an Si epitaxial layer having a polycrystalline or monocrystalline structure.

Then, an insulating layer 553L is formed on the channel layer 550L so as to fill the remaining portion of the first hole 419. The insulating layer 553L may be formed by depositing an insulating material on the channel layer 550L so as to fill the remaining portion of the first hole 419 and then performing an annealing process. The insulating layer 553L may be formed as an oxide film.

Referring to FIG. 13B, a CMP process or an etch-back process is performed on the insulating layer 553L so as to expose a portion of the channel layer 550L, which covers an upper surface of a top layer of interlayer dielectric layers 414. Then, a CMP process or an etch-back process is performed so as to remove the exposed portion of the channel layer 550L and expose the upper surface of the top layer of the interlayer dielectric layers 414. As a result, an insulation pillar 553 and a channel region 550 surrounding the insulation pillar 553 in a ring-type pillar shape are formed in the first hole 419.

Referring to FIG. 13C, as described above in relation to FIG. 5F, under an etching condition in which etching of the channel region 550 is suppressed, and the gate dielectric layer 440, the top layer of the interlayer dielectric layers 414, and the insulation pillar 553 have relatively high etch selectivities, the gate dielectric layer 440, the top layer of the interlayer dielectric layers 414, and the insulation pillar 553 are selectively etched so as to be removed by a predetermined thickness to expose an upper surface and a side wall of an upper end 550T of the channel region 550.

Then, as described above in relation to FIG. 5G, a bit line 580, as illustrated in FIG. 12, is formed on the channel region 550.

Figure 14:
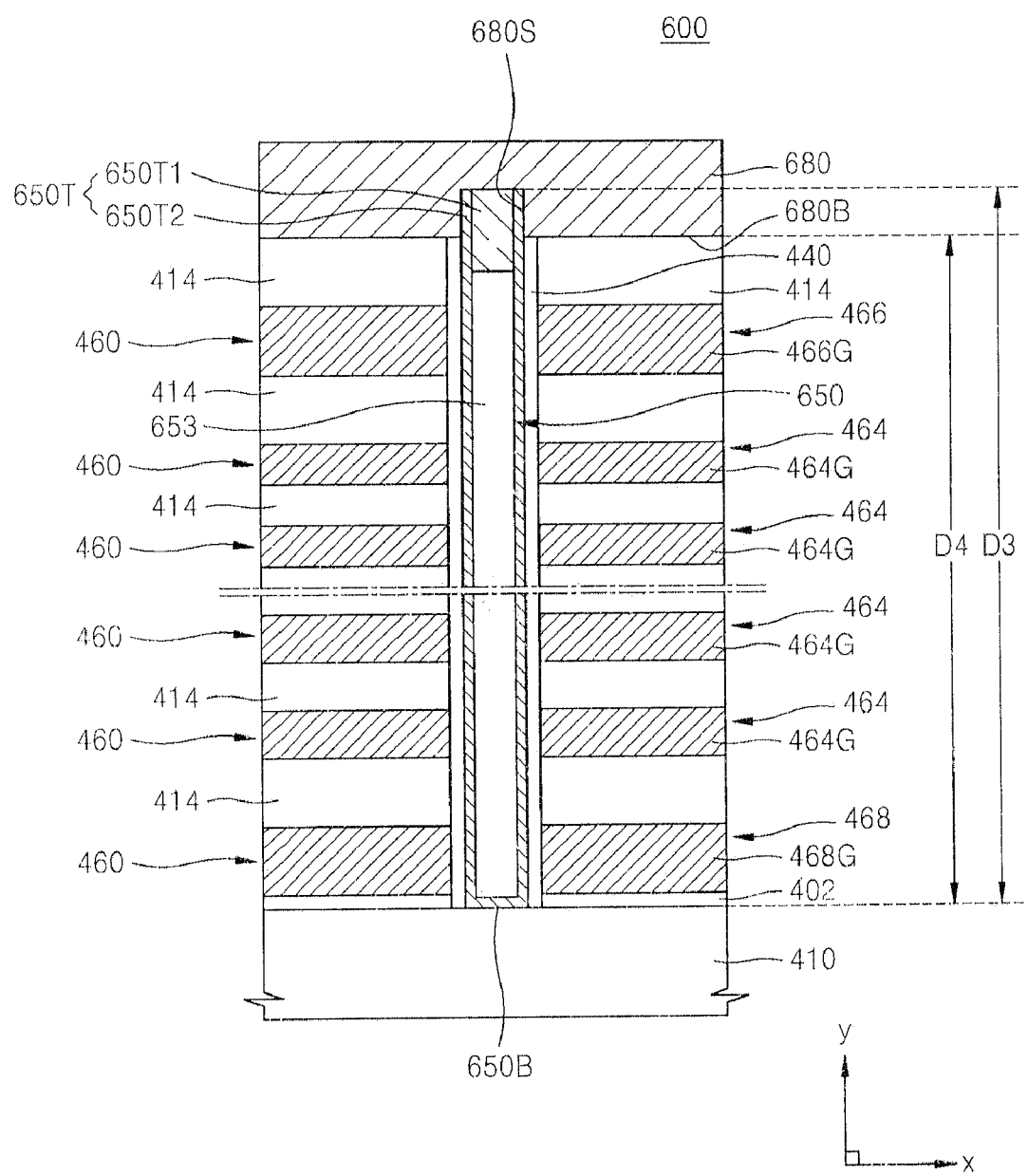
FIG. 14 is a cross-sectional view of a part of a flash memory device, according to an embodiment of the inventive concept.

FIG. 14 is a cross-sectional view of a part of a flash memory device 600, according to an embodiment of the inventive concept.

Like reference numerals in FIGS. 10, 12, and 14 denote like elements.

The schematic structure of the flash memory device 600 is similar to that of the flash memory device 500 illustrated in FIG. 12. In the flash memory device 600, a channel region 650 has a ring-type pillar shape and is filled with an insulation pillar 653. Also, an upper end 650T of the channel region 650 includes a first upper end 650T1 covering an upper surface of the insulation pillar 653, and a second upper end 650T2 surrounding the first upper end 650T1 in a ring-type pillar shape. The insulation pillar 653 is completely surrounded by the channel region 650. The upper end 650T of the channel region 650 may be doped with impurities.

The upper surfaces of the first and second upper ends 650T1 and 650T2 are exposed. The upper end 650T of the channel region 650 has an upper surface level higher than that of the insulation pillar 653 and protrudes to a higher level than a top layer of interlayer dielectric layers 414.

The channel region 650 may be formed as a semiconductor layer such as an Si layer. The first upper end 650T1 of the channel region 650 may also be formed as a semiconductor layer such as an Si layer. A lower surface 650B of the channel region 650 under the insulation pillar 653 contacts a portion of an upper surface of a substrate 410.

A bit line 680 is formed to surround a side wall and an upper surface of a pillar-shaped protrusion of the upper end 650T of the channel region 650, which includes the first and second upper ends 650T1 and 650T2 of the channel region 650. As a result, the bitline 580 directly contacts the channel region 650. A recess 680S defining a space corresponding to the pillar-shaped protrusion of the upper end 650T is formed in the bit line 680 so as to surround the pillar-shaped protrusion.

Except for the above description, the structure of the bit line 680 is the same as that of the bit line 180 described above in relation to FIGS. 3, 4A, 4B, and 5A through 5G.

Figure 15A:
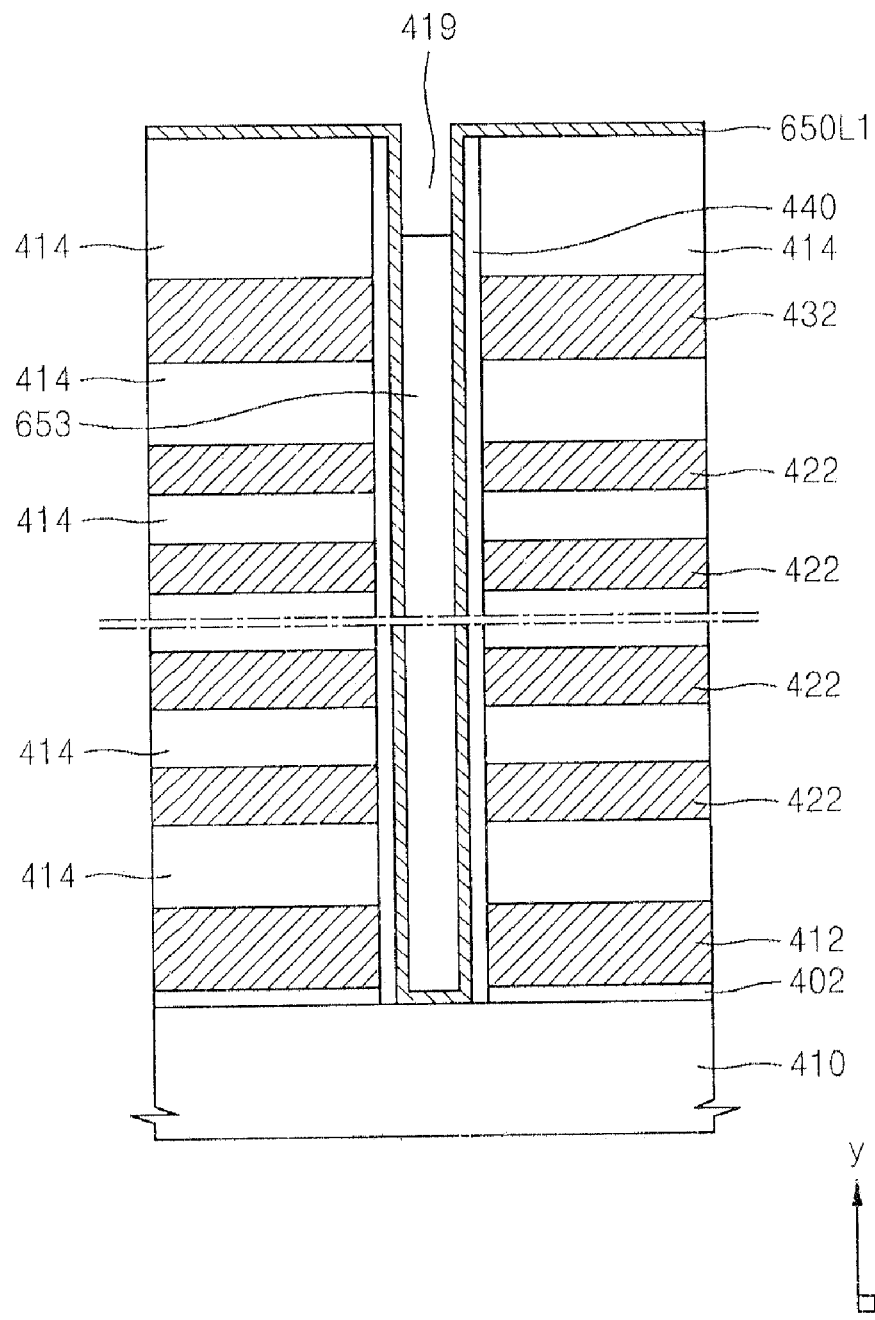
FIGS. 15A through 15C are sequential cross-sectional views for describing a method of manufacturing the flash memory device illustrated in FIG. 14, according to an embodiment of the inventive concept.
Figure 15B:
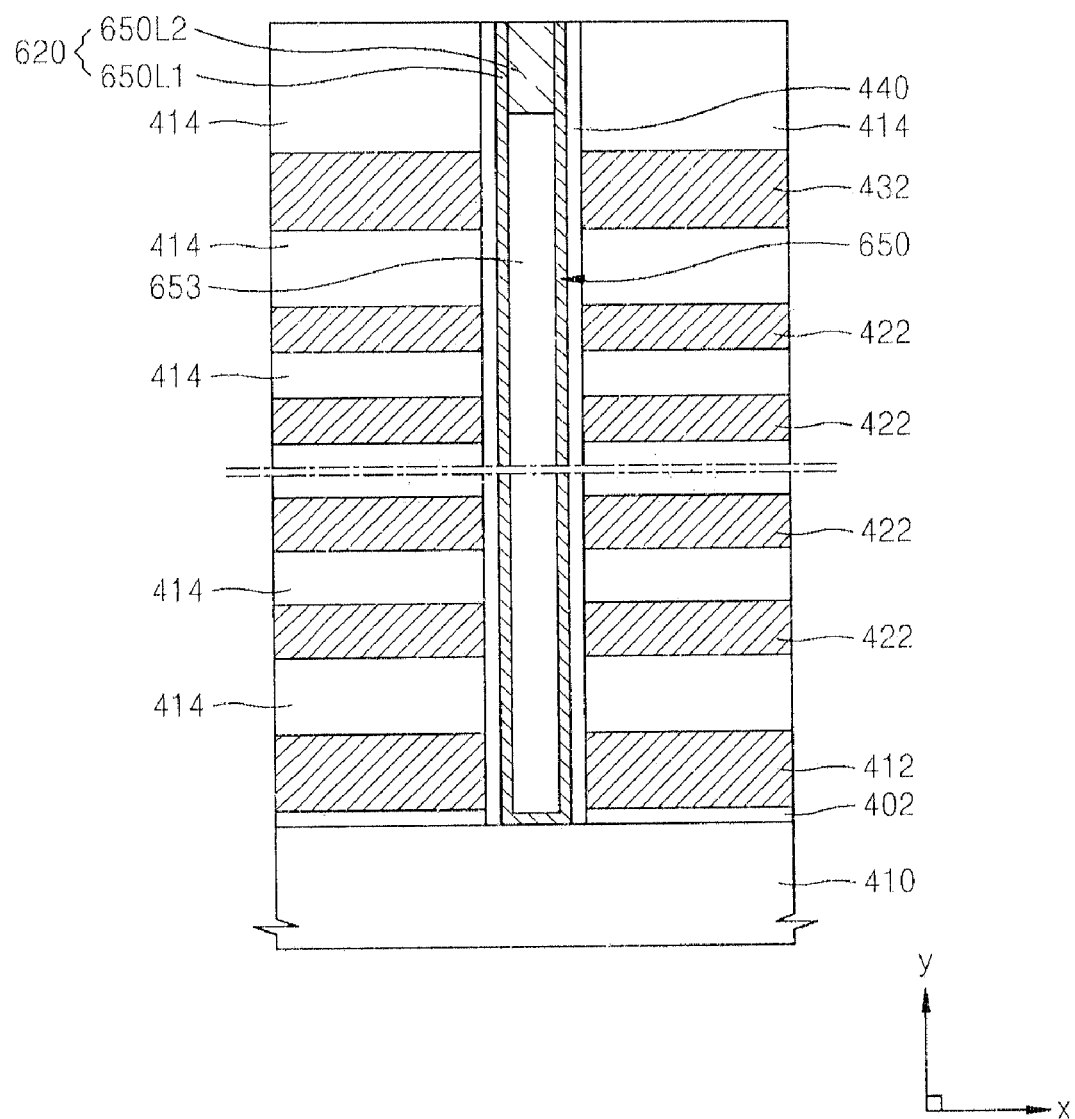
Figure 15C:
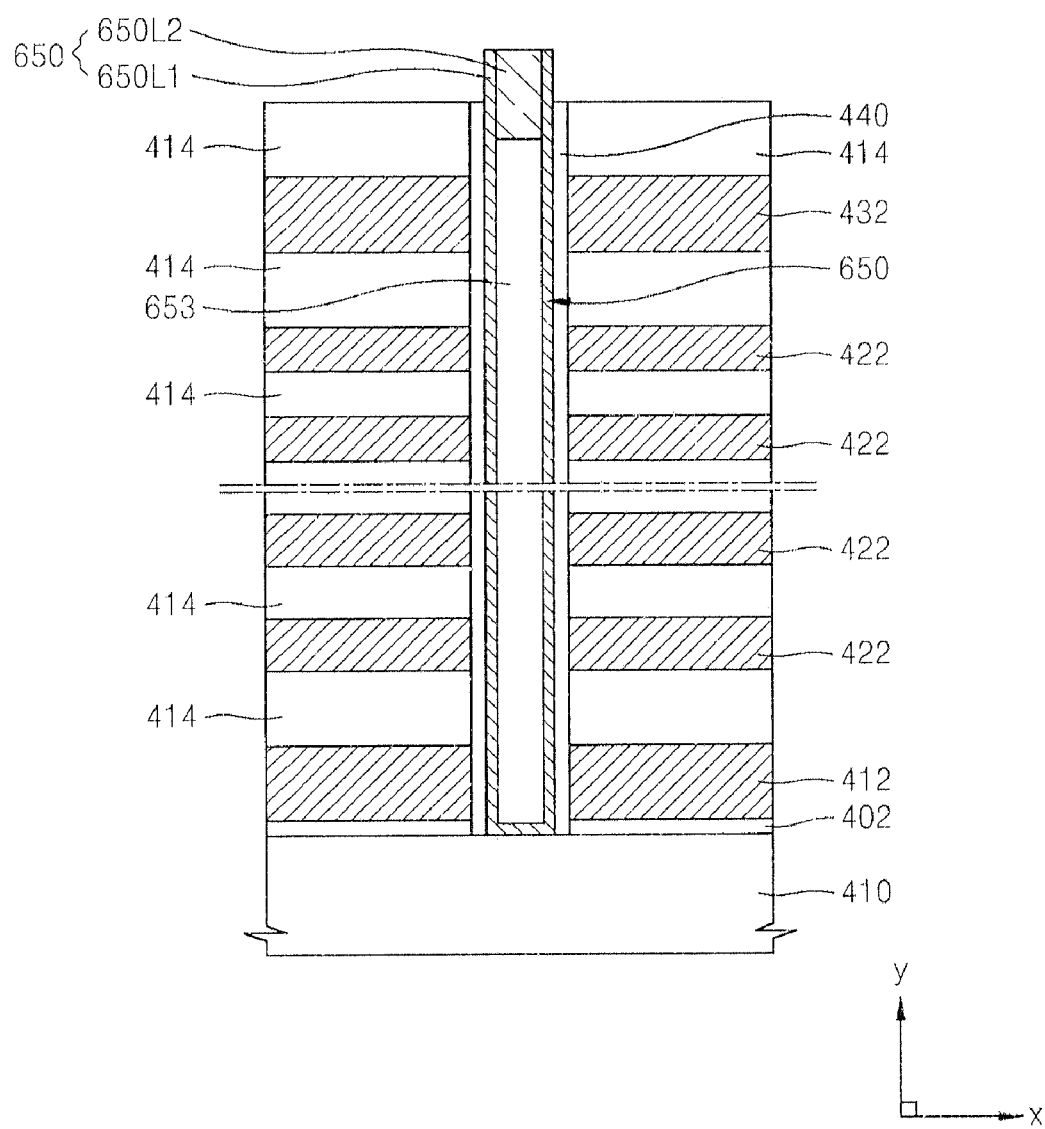

FIGS. 15A through 15C are sequential cross-sectional views for describing a method of manufacturing the flash memory device 600 illustrated in FIG. 14, according to an embodiment of the inventive concept.

Referring to FIG. 15A, as described above in relation to FIG. 13, the same processes are performed until a first channel layer 650L1 is formed on a substrate 410. The description of the first channel layer 650L1 is the same as that of the channel layer 550L illustrated in FIG. 13A.

Then, as described above in relation to FIG. 9A, an insulating layer (see 323L of FIG. 9A) is formed on the first channel layer 650L1 so as to fill the remaining portion of a first hole 419. Then, a CMP process or an etch-back process is performed on the insulating layer, thereby forming an insulation pillar 653 having an upper surface level lower than that of the first channel layer 650L1. As a result, an internal wall of the first channel layer 650L1 above the insulation pillar 653 is exposed.

Referring to FIG. 15B, as described above in relation to FIG. 9B, a second channel layer 650L2 is formed on the insulation pillar 653 and the first channel layer 650L1 so as to fill the remaining portion of the first hole 419. Then, as described above in relation to FIG. 9C, an upper portion of the second channel layer 650L2 and a portion of the first channel layer 650L1, which covers an upper surface of a top layer of interlayer dielectric layers 414, are removed so as to expose the upper surface of the top layer of the interlayer dielectric layers 414. As a result, the first and second channel layers 650L1 and 650L2 remaining in the first hole 419 form a channel region 650.

The description of the second channel layer 650L2 is the same as that of the second channel layer 320L2 illustrated in FIGS. 9B and 9C.

Referring to FIG. 15C, as described above in relation to FIG. 9D, under an etching condition in which etching of the channel region 650 is suppressed, and a gate dielectric layer 440 and the top layer of the interlayer dielectric layers 414 have relatively high etch selectivities, the gate dielectric layer 440 and the top layer of the interlayer dielectric layers 414 are selectively etched so as to be removed by a predetermined thickness to expose an upper surface and a side wall of an upper end (see 650T of FIG. 14) of the channel region 650.

Then, as described above in relation to FIG. 5G, the bit line 680 illustrated in FIG. 14 is formed on the channel region 650.

Figure 16:
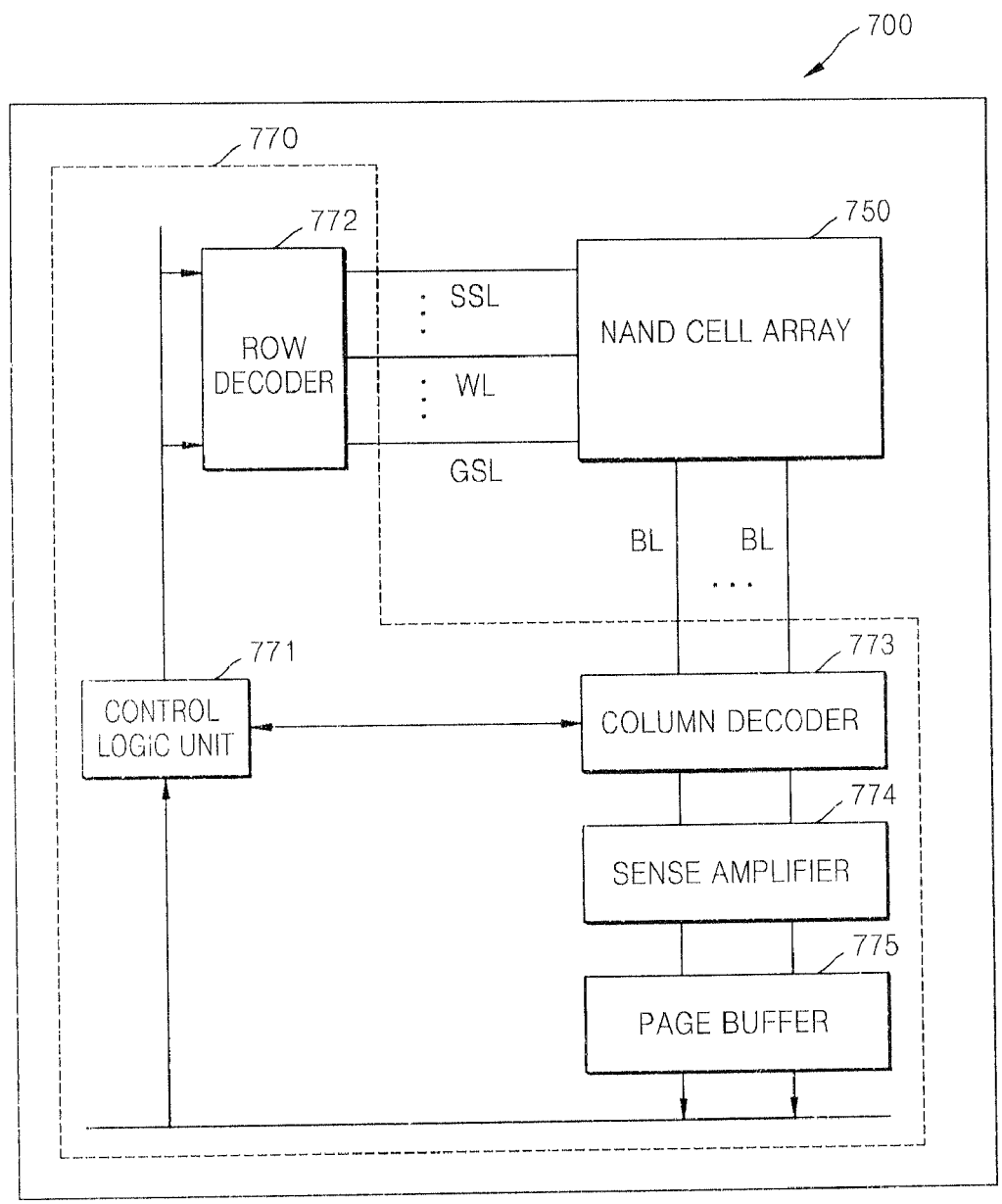
FIG. 16 is a block diagram of a flash memory device, according to an embodiment of the inventive concept.

FIG. 16 is a block diagram of a flash memory device 700, according to an embodiment of the inventive concept.

Referring to FIG. 16, in the flash memory device 700, a NAND cell array 750 is combined with a core circuit unit 770. For example, the NAND cell array 750 may include one of the flash memory devices 100, 200, 300, 400, 500, and 600 respectively illustrated in FIGS. 3, 6, 8, 10, 12, and 14. The core circuit unit 770 includes a control logic unit 771, a row decoder 772, a column decoder 773, a sense amplifier 774, and a page buffer 775.

The control logic unit 771 communicates with the row decoder 772, the column decoder 773, and the page buffer 775. The row decoder 772 communicates with the NAND cell array 750 via a plurality of string selection lines SSLs, a plurality of word lines WLs, and a plurality of ground selection lines GSLs. The column decoder 773 communicates with the NAND cell array 750 via a plurality of bit lines BLs. The sense amplifier 774 is connected to the column decoder 773 when a signal is output from the NAND cell array 750, and is not connected to the column decoder 773 when a signal is transmitted to the NAND cell array 750.

For example, the control logic unit 771 transmits a row address signal to the row decoder 772, and the row decoder 772 decodes and transmits the row address signal to the NAND cell array 750 via the string selection lines SSLs, the word lines WLs, and the ground selection lines GSLs. The control logic unit 771 transmits a column address signal to the column decoder 773 or the page buffer 775, and the column decoder 773 decodes and transmits the column address signal to the NAND cell array 750 via the bit lines BLs. A signal of the NAND cell array 750 is transmitted to the sense amplifier 774 via the column decoder 773, and the sense amplifier 774 amplifies the transmitted signal and then transmits the amplified signal to the control logic unit 771 via the page buffer 775.

Figure 17:
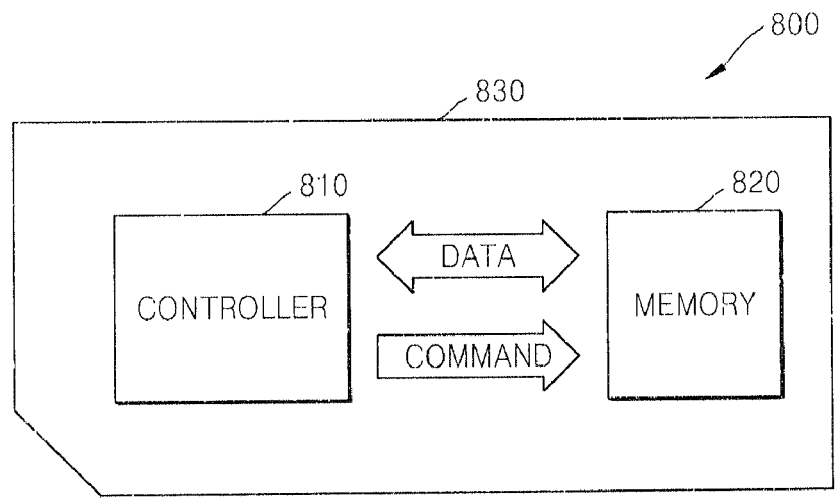
FIG. 17 is a schematic diagram of a memory card, according to an embodiment of the inventive concept.

FIG. 17 is a schematic diagram of a memory card 800, according to an embodiment of the inventive concept.

Referring to FIG. 17, the memory card 800 includes a controller 810 and a memory 820 embedded in a housing 830. The controller 810 and the memory 820 exchange electrical signals. For example, the memory 820 and the controller 810 exchange data according to a command of the controller 810. As such, the memory card 800 stores data in the memory 820 or outputs data from the memory 820.

For example, the memory 820 may include one of the flash memory devices 100, 200, 300, 400, 500, and 600 respectively illustrated in FIGS. 3, 6, 8, 10, 12, and 14. The memory card 800 may be used as a data storage medium of various portable devices. For example, the memory card 800 may include a multi media card (MMC) or a secure digital (SD) card.

Figure 18:
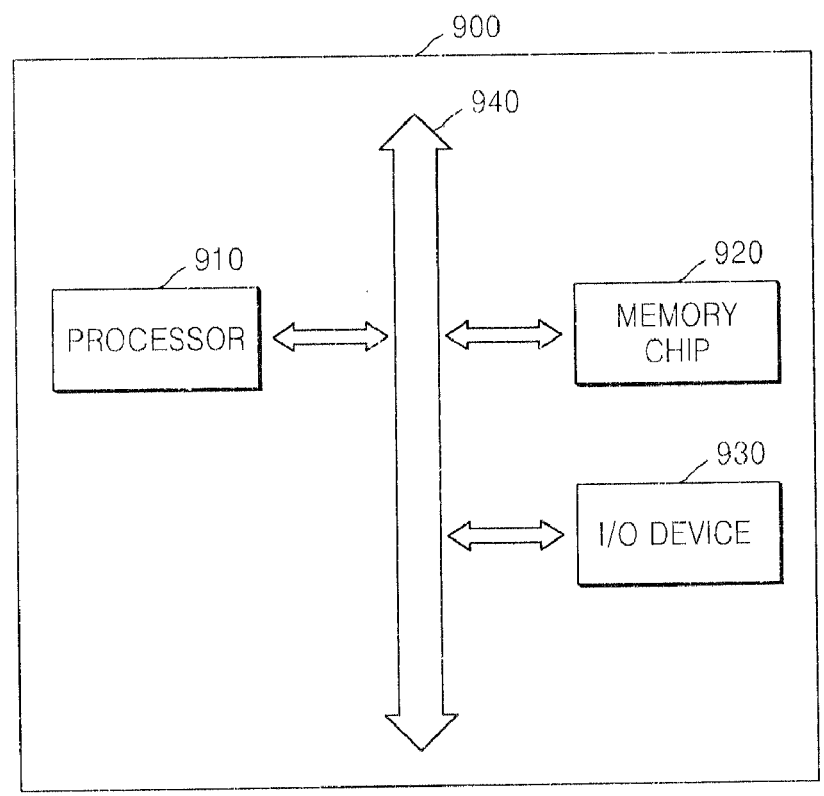
FIG. 18 is a block diagram of an electronic system, according to an embodiment of the inventive concept.

FIG. 18 is a block diagram of an electronic system 900, according to an embodiment of the inventive concept.

Referring to FIG. 18, the electronic system 900 includes a processor 910, an input/output (I/O) device 930, and a memory chip 920, which communicate with each other by using a bus 940. The processor 910 executes a program and controls the electronic system 900. The I/O device 930 is used to input or output data to or from the electronic system 900. The electronic system 900 is connected to an external device such as a personal computer (PC) or a network and exchanges data with the external device, by using the I/O device 930. The memory chip 920 stores codes and data for operating the processor 910. For example, the memory chip 920 includes one of the flash memory devices 100, 200, 300, 400, 500, and 600 respectively illustrated in FIGS. 3, 6, 8, 10, 12, and 14.

The electronic system 900 may form various electronic control devices that require the memory chip 920, and may be used in, for example, a mobile phone, an MP3 player, a car-navigation device, a solid state disk (SSD), and household appliances.

While the inventive concept has been particularly shown and described with reference to exemplary embodiments thereof, it will be understood that various changes in form and details may be made therein without departing from the spirit and scope of the following claims.

What is claimed is:

1. A flash memory device comprising:
   a substrate extending in a first direction;
   a channel region having an internal space and an upper end, and extending from the substrate in a second direction perpendicular to the first direction;
   an insulation pillar filling the internal space of the channel region;
   a memory cell string comprising a plurality of transistors sequentially formed around the channel region in the second direction; and
   a bit line connected to one of the plurality of transistors, and surrounding a side wall and an upper surface of the upper end of the channel region so as to directly contact the channel region,
   wherein the channel region includes:
      a first channel region defining the internal space, and having the side wall surrounded by the bit line; and
      a second channel region overlapping the insulation pillar, and having the upper surface surrounded by the bit line, wherein an upper surface of the first channel region and the upper surface of the second channel region are on the same level.

2. The flash memory device of claim 1, wherein the insulation pillar is spaced apart from the substrate with the first channel region therebetween.

3. The flash memory device of claim 1, wherein the second channel region has a side wall surrounded by the first channel region.

4. The flash memory device of claim 1, wherein the upper surface of the one end of the channel region is spaced apart from the substrate by a first distance,
   wherein a lower surface of the bit line is spaced apart from the substrate by a second distance, and
   wherein the second distance is less than the first distance.

5. The flash memory device of claim 1, wherein the upper end of the channel region comprises a protrusion covered by the bit line, and
   wherein a recess is formed in the bit line so as to surround the protrusion.

6. The flash memory device of claim 5, wherein the recess of the bit line has a circular shape with respect to a lower surface of the bit line.

7. The flash memory device of claim 1, wherein the memory cell string comprises:
   a plurality of first transistors forming a plurality of memory cells;
   a second transistor functioning as a string selection transistor; and
   a third transistor functioning as a ground selection transistor, and
   wherein the bit line is connected to the second transistor.

8. The flash memory device of claim 7, wherein the memory cell string comprises one second transistor.

9. The flash memory device of claim 7, wherein the memory cell string comprises a pair of second transistors arranged in series.

10. The flash memory device of claim 1, wherein a plurality of gate dielectric layers are formed around the channel region,
    wherein an upper surface of the gate dielectric layer is spaced apart from the substrate by a first distance,
    wherein an upper surface of the channel region is spaced apart from the substrate by a second distance, and
    wherein the first distance is less than the second distance.

11. The flash memory device of claim 10, wherein the upper surface of the gate dielectric layer contacts with a lower surface of the bit line.

12. A flash memory device comprising:
    a substrate extending in a first direction;
    a channel region having an internal space and an upper end, and extending from the substrate in a second direction perpendicular to the first direction;
    an insulation pillar filling the internal space of the channel region;
    a memory cell string comprising a plurality of transistors sequentially formed around the channel region in the second direction; and
    a bit line connected to one of the plurality of transistors, and surrounding a side wall and an upper surface of the upper end of the channel region so as to directly contact the channel region,
    wherein the channel region includes:
       a first channel region defining the internal space, and having the side wall surrounded by the bit line; and
       a second channel region overlapping the insulation pillar, and having the upper surface surrounded by the bit line, wherein the insulation pillar is spaced apart from the substrate with the first channel region therebetween.

13. The flash memory device of claim 12, wherein the upper surface of the one end of the channel region is spaced apart from the substrate by a first distance,
    wherein a lower surface of the bit line is spaced apart from the substrate by a second distance, and
    wherein the second distance is less than the first distance.

14. The flash memory device of claim 12, wherein the upper end of the channel region comprises a protrusion covered by the bit line, and
    wherein a recess is formed in the bit line so as to surround the protrusion.

15. The flash memory device of claim 14, wherein the recess of the bit line has a circular shape with respect to a lower surface of the bit line.

16. The flash memory device of claim 12,
    wherein the memory cell string comprises:
       a plurality of first transistors forming a plurality of memory cells;
       a second transistor functioning as a string selection transistor; and
       a third transistor functioning as a ground selection transistor, and
    wherein the bit line is connected to the second transistor.

17. The flash memory device of claim 16, wherein the memory cell string comprises one second transistor.

18. The flash memory device of claim 16, wherein the memory cell string comprises a pair of second transistors arranged in series.

19. The flash memory device of claim 12, wherein a plurality of gate dielectric layers are formed around the channel region,
    wherein an upper surface of the gate dielectric layer is spaced apart from the substrate by a first distance,
    wherein an upper surface of the channel region is spaced apart from the substrate by a second distance, and
    wherein the first distance is less than the second distance.

20. The flash memory device of claim 19, wherein the upper surface of the gate dielectric layer contacts with a lower surface of the bit line.

* * * * *